United States Patent
Komatsu et al.

(10) Patent No.: US 10,797,705 B2
(45) Date of Patent: Oct. 6, 2020

(54) CIRCUIT DEVICE, OSCILLATOR, ELECTRONIC APPARATUS, AND VEHICLE

(71) Applicant: SEIKO EPSON CORPORATION, Tokyo (JP)

(72) Inventors: Fumikazu Komatsu, Okaya (JP); Minoru Kozaki, Fujimi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/561,397

(22) Filed: Sep. 5, 2019

(65) Prior Publication Data
US 2020/0083844 A1 Mar. 12, 2020

(30) Foreign Application Priority Data
Sep. 6, 2018 (JP) .................................. 2018-166529

(51) Int. Cl.
*H03K 19/0185* (2006.01)
*H03F 3/45* (2006.01)
*H03K 19/0175* (2006.01)
*H03F 3/72* (2006.01)
*H03B 5/32* (2006.01)

(52) U.S. Cl.
CPC ....... *H03K 19/018528* (2013.01); *H03B 5/32* (2013.01); *H03F 3/45183* (2013.01); *H03F 3/72* (2013.01); *H03K 19/017509* (2013.01); *H03K 19/018514* (2013.01); *H03K 19/018585* (2013.01); *H03B 2200/0002* (2013.01); *H03B 2200/0034* (2013.01)

(58) Field of Classification Search
CPC ... H03K 19/017509; H03K 19/018585; H03K 19/018528; H03K 19/018521; H03K 19/018514; H04L 25/0276; H03F 3/45179; H03F 3/45183; H03F 3/72; H03G 1/0088
See application file for complete search history.

(56) References Cited

U.S. PATENT DOCUMENTS 7,145,359 B2 * 12/2006 Hein ............. H03K 19/018585
326/38
2007/0279124 A1 12/2007 Watarai
2008/0106301 A1 5/2008 Fukushi

FOREIGN PATENT DOCUMENTS

| JP | H09-162717 A | 6/1997 |
| JP | 2007-324799 A | 12/2007 |
| JP | 2008-118382 A | 5/2008 |

* cited by examiner

*Primary Examiner* — Ryan Johnson
(74) *Attorney, Agent, or Firm* — Oliff PLC

(57) ABSTRACT

A circuit device includes first and second output signal lines from which first and second output signals constituting differential output signals are output, and first to n-th output drivers coupled to the first and second output signal lines. In a first mode, i number of output drivers of the first to n-th output drivers drive the first and second output signal lines based on first and second input signals constituting differential input signals. In a second mode, j number of output drivers of the first to n-th output drivers drive the first and second output signal lines based on the first and second input signals.

20 Claims, 15 Drawing Sheets

FIG. 14
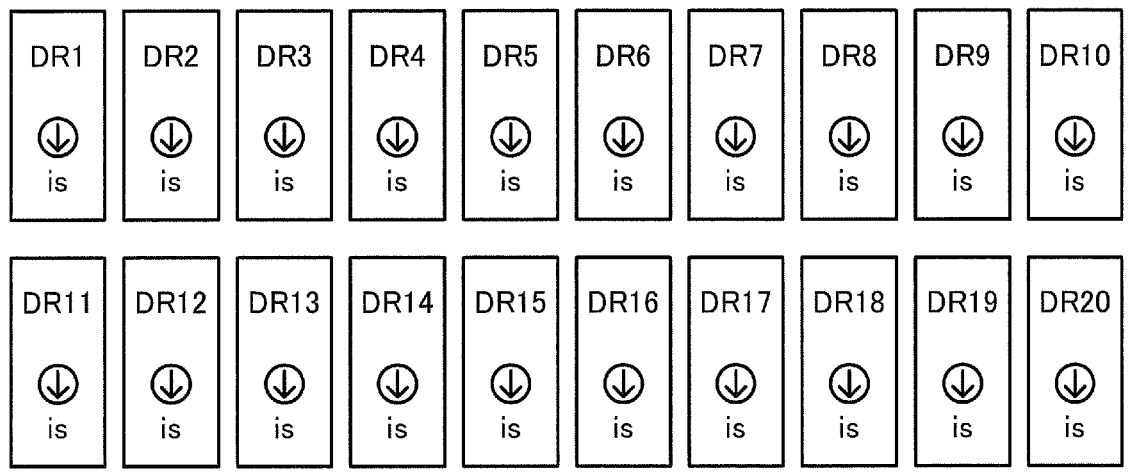
FIG. 15
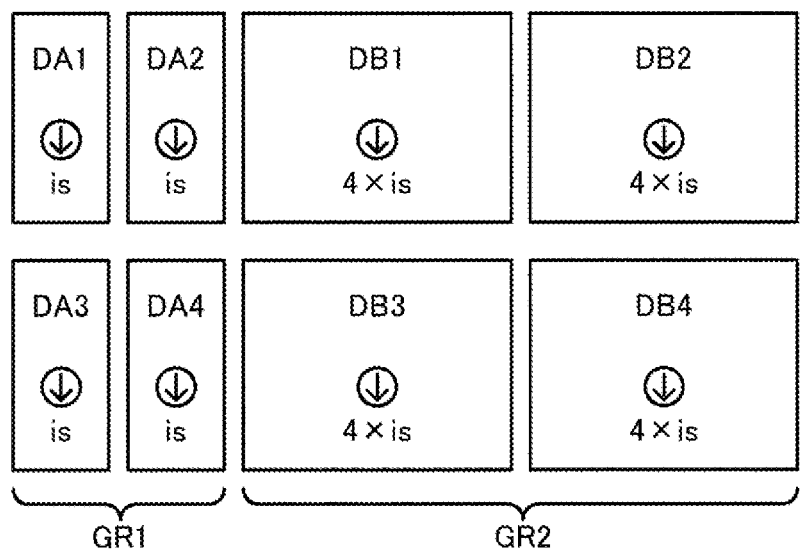
FIG. 16

FIG. 17

| D1 | D2 | D3 | D5 | D9 |
|---|---|---|---|---|
| ↓ | ↓ | ↓ | ↓ | ↓ |
| is | 2×is | 3×is | 5×is | 9×is |

FIG. 18

| D1 | D2 | D3 | D6 | D8 |
|---|---|---|---|---|
| ↓ | ↓ | ↓ | ↓ | ↓ |
| is | 2×is | 3×is | 6×is | 8×is |

FIG. 19

| D1 | D2 | D3 | D7 | D7 |
|---|---|---|---|---|
| ↓ | ↓ | ↓ | ↓ | ↓ |
| is | 2×is | 3×is | 7×is | 7×is |

FIG. 20

| D1 | D2 | D4 | D5 | D8 |
|---|---|---|---|---|
| ↓ | ↓ | ↓ | ↓ | ↓ |
| is | 2×is | 4×is | 5×is | 8×is |

FIG. 21

| D1 | D2 | D4 | D6 | D7 |
|---|---|---|---|---|
| ↓ | ↓ | ↓ | ↓ | ↓ |
| is | 2×is | 4×is | 6×is | 7×is |

CIRCUIT DEVICE, OSCILLATOR, ELECTRONIC APPARATUS, AND VEHICLE

The present application is based on, and claims priority from JP Application Serial Number 2018-166529, filed Sep. 6, 2018, the disclosure of which is hereby incorporated by reference herein in its entirety.

BACKGROUND

1. Technical Field

The present disclosure relates to a circuit device, an oscillator, an electronic apparatus, and a vehicle.

2. Related Art

The related art of an output circuit that outputs a differential output signal includes, for example, a technology disclosed in JP-A-2007-324799. The output circuit includes a differential output section that amplifies an input differential signal and outputs the amplified differential signal, a current source section that supplies current to the differential output section, a load resistance section that is coupled to the differential output section, and a control unit that sets a current value of the current source section and a resistance value of the load resistance section. The output circuit converts the differential signal into an output signal having a different interface level, and transmits the converted signal through balancing.

In the output circuit described in JP-A-2007-324799, a differential signal having a level conforming to a standard of each interface is output by setting the current value of the current source section and the resistance value of the load resistance section by means of a control unit. However, JP-A-2007-324799 neither discloses nor suggests a technical point of view to cope with various interfaces while suppressing an increase in circuit area.

SUMMARY

An advantage of some aspects of the present disclosure is to solve at least a part of the problems described above, and the present disclosure can be implemented as the following aspects or embodiments.

An aspect of the present disclosure relates to a circuit device including a first output signal line from which a first output signal constituting differential output signals is output, a second output signal line from which a second output signal constituting the differential output signals is output, and first to n-th output drivers for differential input and differential output that are coupled to the first output signal line and the second output signal line, n being an integer of 2 or more. In a first mode, i number of output drivers of the first to n-th output drivers drive the first output signal line and the second output signal line based on a first input signal and a second input signal constituting differential input signals, i being an integer of $1 \leq i \leq n$, and in a second mode, j number of output drivers of the first to n-th output drivers drive the first output signal line and the second output signal line based on the first input signal and the second input signal, j being an integer of $1 \leq j \leq n$ and $j \neq i$.

BRIEF DESCRIPTION OF THE DRAWINGS

FIG. 14 is a first arrangement configuration example of the output driver.

FIG. 15 is a second arrangement configuration example of the output driver.

FIG. 16 is another arrangement configuration example of the output driver.

FIG. 17 is another arrangement configuration example of the output driver.

FIG. 18 is another arrangement configuration example of the output driver.

FIG. 19 is another arrangement configuration example of the output driver.

FIG. 20 is another arrangement configuration example of the output driver.

FIG. 21 is another arrangement configuration example of the output driver.

DESCRIPTION OF EXEMPLARY EMBODIMENTS

Hereinafter, a preferred embodiment of the present disclosure will be described in detail. The present embodiment to be described below does not wrongfully limit the contents of the present disclosure described in the appended Claims, and all configurations described in the present embodiment are not essential as means for solving in the present disclosure.

1. Configuration of Circuit Device

Figure 1:
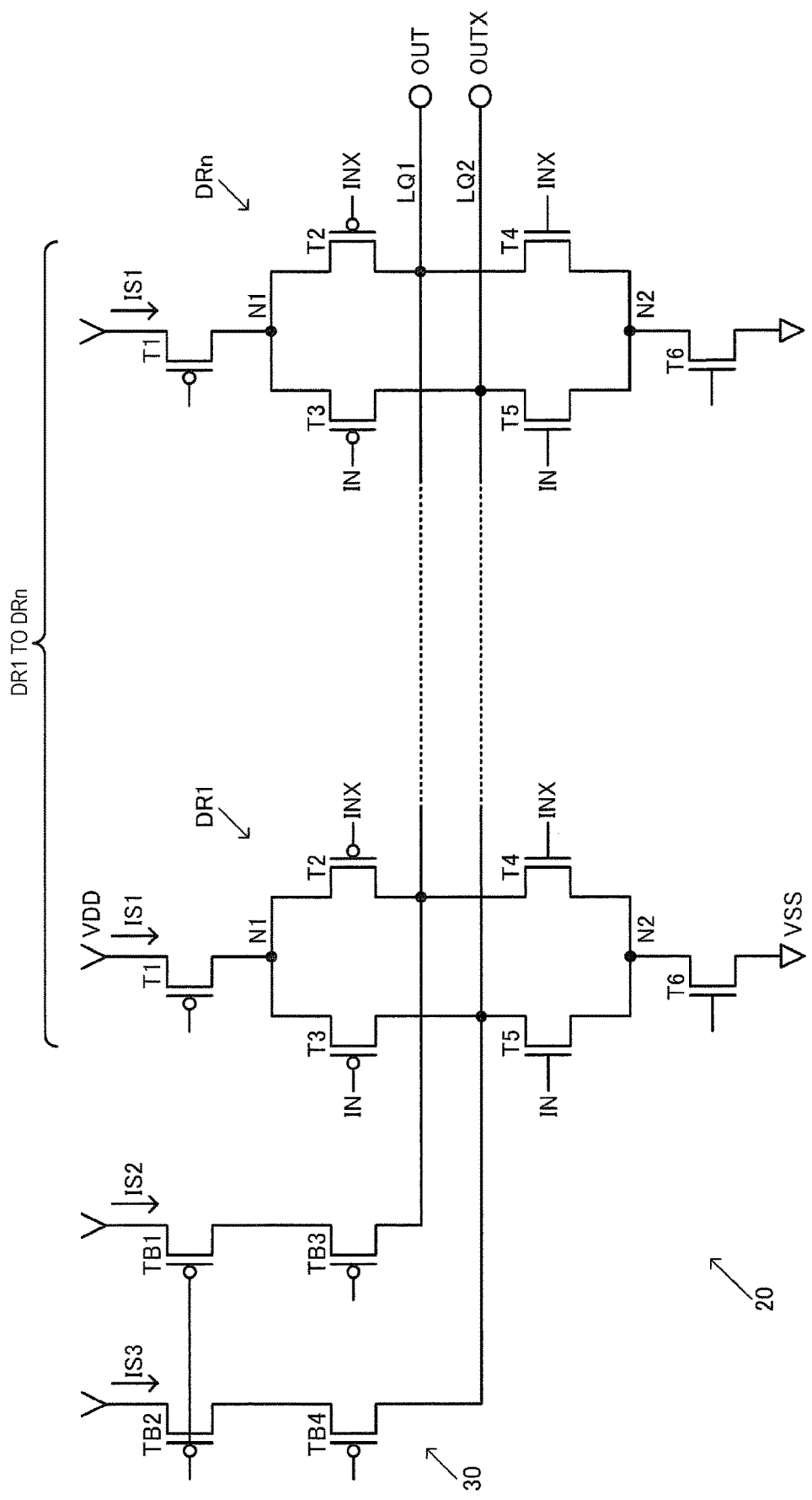
FIG. 1 is a configuration example of a circuit device of the present embodiment.

A configuration example of a circuit device 20 of the present embodiment is shown in FIG. 1. The circuit device 20 includes an output signal line LQ1 from which an output signal OUT constituting differential output signals is output, an output signal line LQ2 from which an output signal OUTX constituting the differential output signals is output, and output drivers DR1 to DRn. The output signal OUT, the output signal OUTX, the output signal line LQ1, and the output signal line LQ2 are a first output signal, a second output signal, a first output signal line, and a second output signal line, respectively. The output signal OUT and the output signal OUTX are the differential output signals, and are signals to be transmitted through balancing. For example, the output signal OUT is a signal at a positive polarity side, and the output signal OUTX is a signal at a negative polarity side. Here, X indicates negative logic. The output signal lines LQ1 and LQ2 are signal wires of the circuit device 20, and are, for example, wires formed at a conductive layer such as an aluminum layer. The output signal lines LQ1 and LQ2 are coupled to, for example, external output terminals which are pads of the circuit device 20.

The output drivers DR1 to DRn are first to n-th output drivers. Here, n is an integer of 2 or more. The output drivers DR1 to DRn are drivers for differential input and differential output which are coupled to the output signal lines LQ1 and LQ2. An input signal IN and an input signal INX can be input to the output drivers DR1 to DRn. The input signal IN and the input signal INX are a first input signal and a second input signal, respectively, and are signals to be transmitted through balancing. For example, the input signal IN is a signal at a positive polarity side, and the input signal INX is a signal at a negative polarity side. For example, DR1 to DRn as a plurality of output drivers are commonly coupled to the output signal lines LQ1 and LQ2. The output drivers DR1 to DRn output signals obtained by buffering the input signals IN and INX, as the output signals OUT and OUTX. Specifically, the output drivers DR1 to DRn output, as the output signals OUT and OUTX, signals obtained by converting the input signals IN and INX each having, for example, a voltage amplification range of VDD to VSS so as to have signal waveforms corresponding to various interfaces such as LVDS, PECL, HCSL, and CMOS to be described below.

For example, each of the output drivers DR1 to DRn includes a current source, a differential section, and a load resistance section. For example, a transistor T1 of FIG. 1 constitutes the current source, transistors T2, T3, T4, and T5 constitute the differential section, and a transistor T6 constitutes a load resistance section. The differential section is a circuit for differential input and differential output. The transistor T1 is provided between a node of VDD which is a power supply at a high potential side and a node N1. The transistor T2 is provided between the node N1 and the output signal line LQ1, and the transistor T3 is provided between the node N1 and the output signal line LQ2. The transistor T4 is provided between the output signal line LQ1 and a node N2, and the transistor T5 is provided between the output signal line LQ2 and the node N2. The transistor T6 is provided between the node N2 and a node of VSS which is a power supply at a low potential side. VSS is, for example, a ground which is a ground potential. The input signals IN and INX are input to the differential section. Specifically, the input signals IN and INX are input to gates of the transistors T2, T3, T4, and T5 constituting the differential section. As will be described below, signals obtained by buffering the input signals IN and INX by means of a pre-buffer or the like are input to the differential section in reality. The coupling in the present embodiment is electrical coupling. The electrical coupling may be coupling established such that an electrical signal can be transmitted, may be coupling established such that information using the electrical signal can be transmitted, and may be coupling established through a signal line or an active element.

In FIG. 1, the circuit device 20 may include a bias current circuit 30. The bias current circuit 30 is a circuit that applies bias currents IS2 and IS3 to the output signal lines LQ1 and LQ2 from VDD which is a power supply at a high potential side. In FIG. 1, the bias current circuit 30 includes, for example, P-type transistors TB1, TB2, TB3, and TB4. Specifically, the transistors TB1 and TB3 are provided in series between a node of VDD and the output signal line LQ1, and the transistors TB2 and TB4 are provided in series between the node of VDD and the output signal line LQ2. The transistors TB1 and TB2 are transistors constituting a current source. The transistors TB3 and TB4 are transistors for controlling such that the flowing of the bias currents IS2 and IS3 to the output signal lines LQ1 and LQ2 from the bias current circuit 30 is turned on or off. For example, a drive current IS1 flows in the transistor T1 constituting the current source of each of the output drivers DR1 to DRn. Meanwhile, the bias currents IS2 and IS3 flow in the transistors TB1 and TB2 constituting the current source of the bias current circuit 30. Current values of the bias currents IS2 and IS3 are the same current value. The bias current circuit 30 is not an essential component of the circuit device 20. For example, when the bias current circuit does not perform an operation of PECL to be described below, the configuration of the bias current circuit 30 is not necessary.

In the present embodiment, in a first mode, i number of output drivers of the output drivers DR1 to DRn drive the output signal lines LQ1 and LQ2 based on the input signals IN and INX constituting the differential input signals. That is, the i number of output drivers output the output signals OUT and OUTX corresponding to the input signals IN and INX to the output signal lines LQ1 and LQ2. Specifically, the i number of output drivers output the output signals OUT and OUTX each having a signal waveform corresponding to an interface of the first mode to the output signal lines LQ1 and LQ2. Meanwhile, in a second mode, j number of output drivers of the output drivers DR1 to DRn drive the output signal lines LQ1 and LQ2 based on the input signals IN and INX constituting the differential input signals. That is, the j number of output drivers output the output signals OUT and OUTX corresponding to the input signals IN and INX to the output signal lines LQ1 and LQ2. Specifically, the j number of output drivers output the output signals OUT and OUTX each having a signal waveform corresponding to an interface of the second mode to the output signal lines LQ1 and LQ2. Here, i is an integer of $1 \leq i \leq n$, and j is an integer of $1 \leq j \leq n$ and j #1. For example, i=j=1 is not satisfied. However, i=1 and $j \geq 2$ may be satisfied, or j=1 and $i \geq 2$ may be satisfied. For example, the first mode is an operation mode which realizes one interface of low voltage differential signaling (LVDS), positive emitter coupled logic (PECL), high speed current steering logic (HCSL), and a differential complementary MOS (CMOS). The second mode is an operation mode which realizes an interface different from the one interface. According to the circuit device 20 of the present embodiment having the configuration of FIG. 1, it is possible to cope with various interfaces such as LVDS, PECL, HCSL, and CMOS while suppressing an increase in circuit area.

Figure 2:
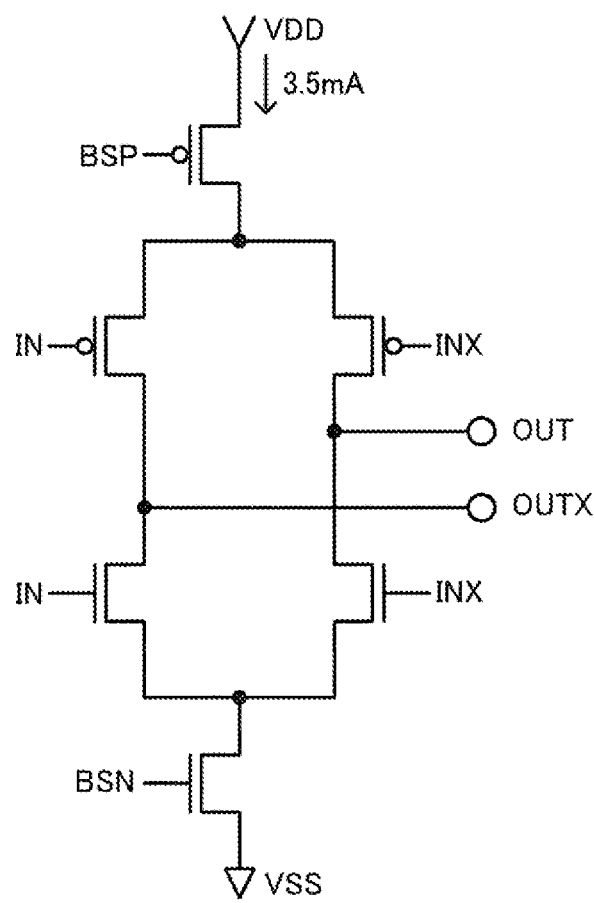
FIG. 2 is an explanatory diagram of an output driver of LVDS.
Figure 6:
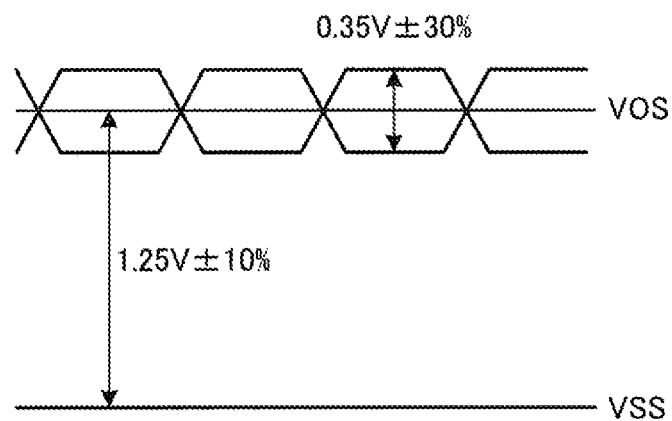
FIG. 6 is a signal waveform example of a differential output signal of LVDS.

Next, LVDS, PECL, HCSL, and CMOS will be described. FIG. 2 is a configuration example of a dedicated output driver of LVDS. The output driver includes a P-type transistor for a current source that applies a drive current of 3.5 mA, P-type and N-type transistors constituting a differential section to which differential input signals IN and INX are input and which outputs differential output signals OUT and OUTX, and an N-type transistor provided at a side of VSS. A bias voltage BSP is applied to a gate of the P-type transistor as the current source. Accordingly, the drive current of 3.5 mA flows. FIG. 6 is an example of a signal waveform of the differential output signal of LVDS. The differential output signal of LVDS is a signal having an amplitude of 0.35 V in which a central voltage is VOS=1.25 V with VSS which is GND as a reference. In reality, VOS is 1.25 V±10% and the amplitude is 0.35 V±30%. In LVDS, an external load of 100Ω is coupled between a node of the output signal OUT and a node of the output signal OUTX. The current of 3.5 mA flows in the external load of 100Ω, and thus, the amplitude of the differential output signal is 0.35 V. A configuration of M-LVDS in which two external loads of 100Ω are coupled in parallel between the node of the output signal OUT and the output signal OUTX and a drive current of 7 mA which doubles 3.5 mA flows may be adopted.

Figure 3:
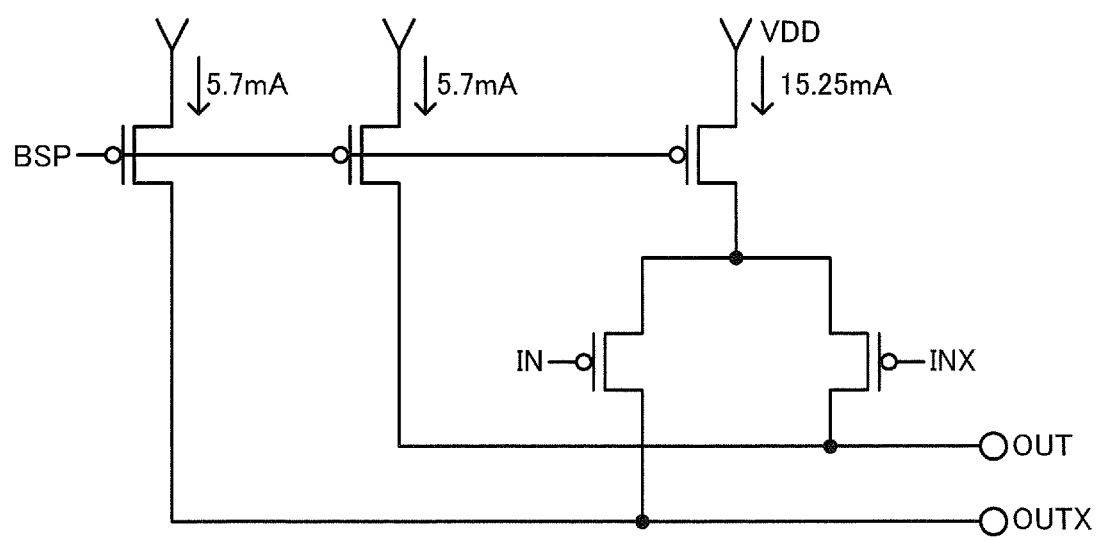
FIG. 3 is an explanatory diagram of an output driver of PECL.
Figure 7:
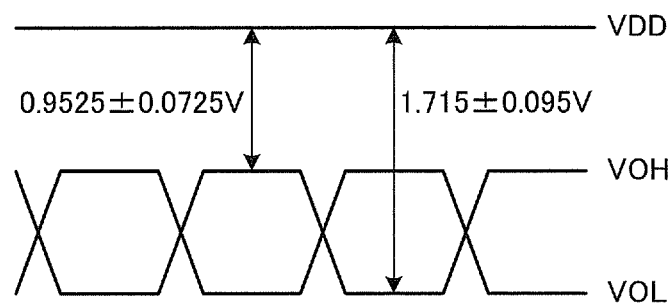
FIG. 7 is a signal waveform example of a differential output signal of PECL.

FIG. 3 is a configuration example of a dedicated output driver of PECL. The output driver includes a P-type transistor that applies a drive current of 15.25 mA, two P-type transistors constituting a differential section, and two P-type transistors constituting a bias current circuit that applies a bias current of 5.7 mA to nodes of output signals OUT and OUTX. The output driver is referred to as low voltage positive emitter coupled logic (LV-PECL) in reality, but is simply referred to as PECL in the present embodiment. FIG. 7 is an example of a signal waveform of a differential output signal of PECL. The differential output signal of PECL is a signal having an amplitude in which a voltage at a high potential side is VOH and a voltage at a low potential side is VOL. VOH is a voltage of 0.9525V at a negative potential side with VDD as a reference, and VOL is a voltage of 1.715 V at a negative potential side with VDD as a reference. In PECL, Thévenin termination, Y termination, or the like is performed at a reception side.

Figure 4:
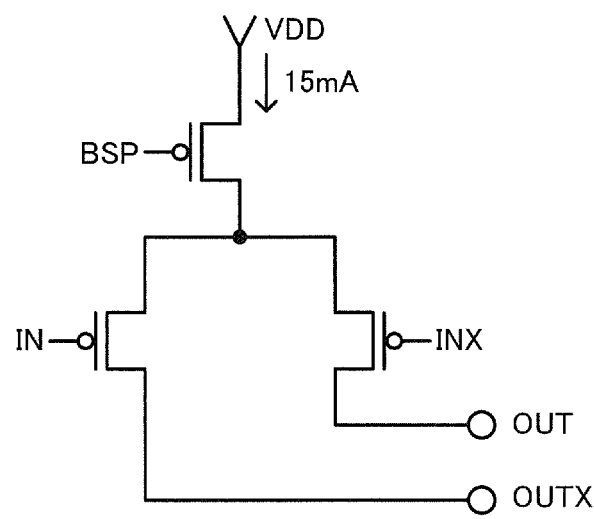
FIG. 4 is an explanatory diagram of an output driver of HCSL.
Figure 8:
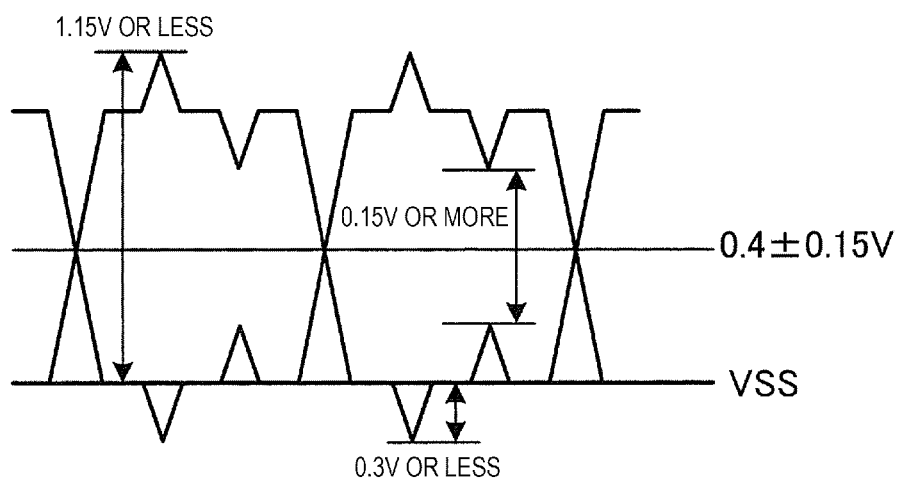
FIG. 8 is a signal waveform example of a differential output signal of HCSL.

FIG. 4 is a configuration example of a dedicated output driver of HCSL. The output driver includes a P-type transistor that applies a drive current of 15 mA, and two P-type transistors constituting a differential section. FIG. 8 is an example of a signal waveform of a differential output signal of HCSL. The differential output signal of HCSL is, for example, a signal having an amplitude of 1.15 V or less in which a central voltage is 0.4 V. In HCSL, termination is performed at a transmission side. A damping resistor of about 33Ω for causing an impedance at a transmission end to be close to 50 Ω is provided. An output driver having a configuration in which a characteristic impedance Z0 at a transmission path is 85Ω and a drive current of 17.6 mA to 18.8 mA flows may be adopted.

Figure 5:
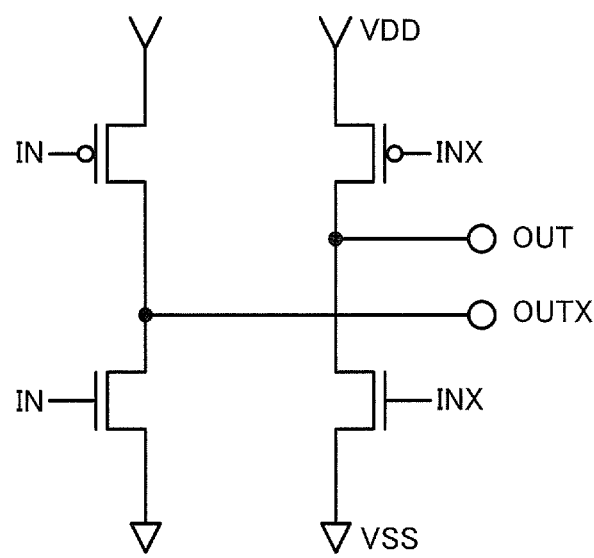
FIG. 5 is an explanatory diagram of an output driver of CMOS.

FIG. 5 is a configuration example of a dedicated output driver of CMOS. The output driver includes a P-type transistor and an N-type transistor which are provided in series between VDD and VSS and in which input signals IN are input to gates, and a P-type transistor and an N-type transistor which are provided in series between VDD and VSS and in which input signals INX are input to gates. The differential output signal of the dedicated output driver of CMOS is a full swing signal having a voltage range of VDD to VSS.

Next, an operation of the circuit device 20 of the present embodiment will be described in detail with reference to FIGS. 9 to 12. Hereinafter, an example in which n=20 and the output drivers DR1 to DRn of FIG. 1 are output drivers DR1 to DR20 will be described. However, the present embodiment is not limited thereto, and n may be smaller than 20 or may be larger than 20.

Figure 9:
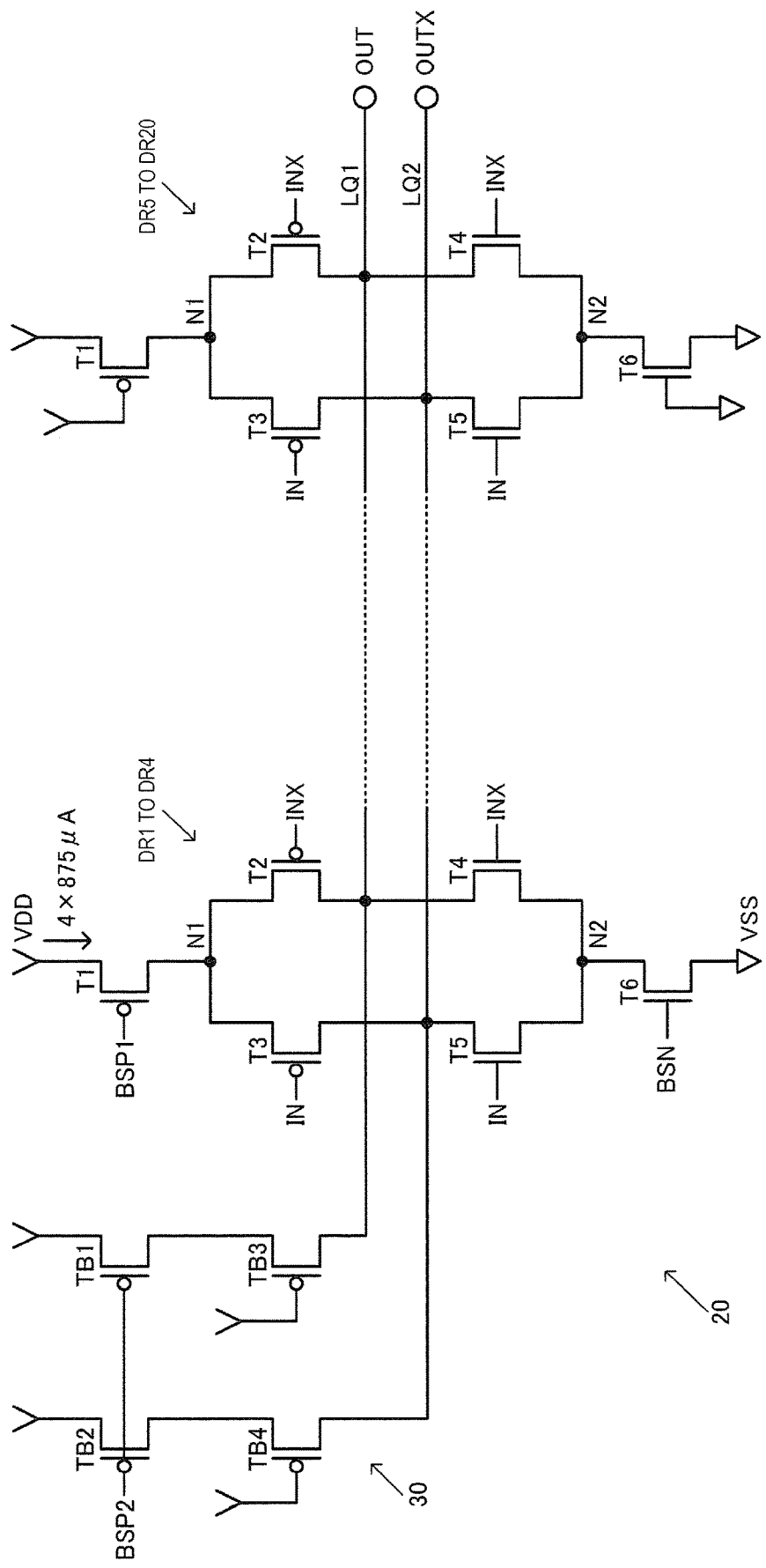
FIG. 9 is an operation explanatory diagram of the circuit device in an operation mode of LVDS.

FIG. 9 is an operation explanatory diagram of the circuit device 20 in an operation mode of LVDS. The operation mode of LVDS is, for example, a first mode. In the operation mode of LVDS, among the output drivers DR1 to DRn, for example, four output drivers DR1 to DR4 in which i=4 drive the output signal lines LQ1 and LQ2 based on the input signals IN and INX. That is, the operations of the four output drivers DR1 to DR4 are turned on, and these four output drivers output the output signals OUT and OUTX to the output signal lines LQ1 and LQ2. Among the output drivers DR1 to DR20, the operations of the output drivers DR5 to DR20 other than the four output drivers DR1 to DR4 are turned off.

Figure 22:
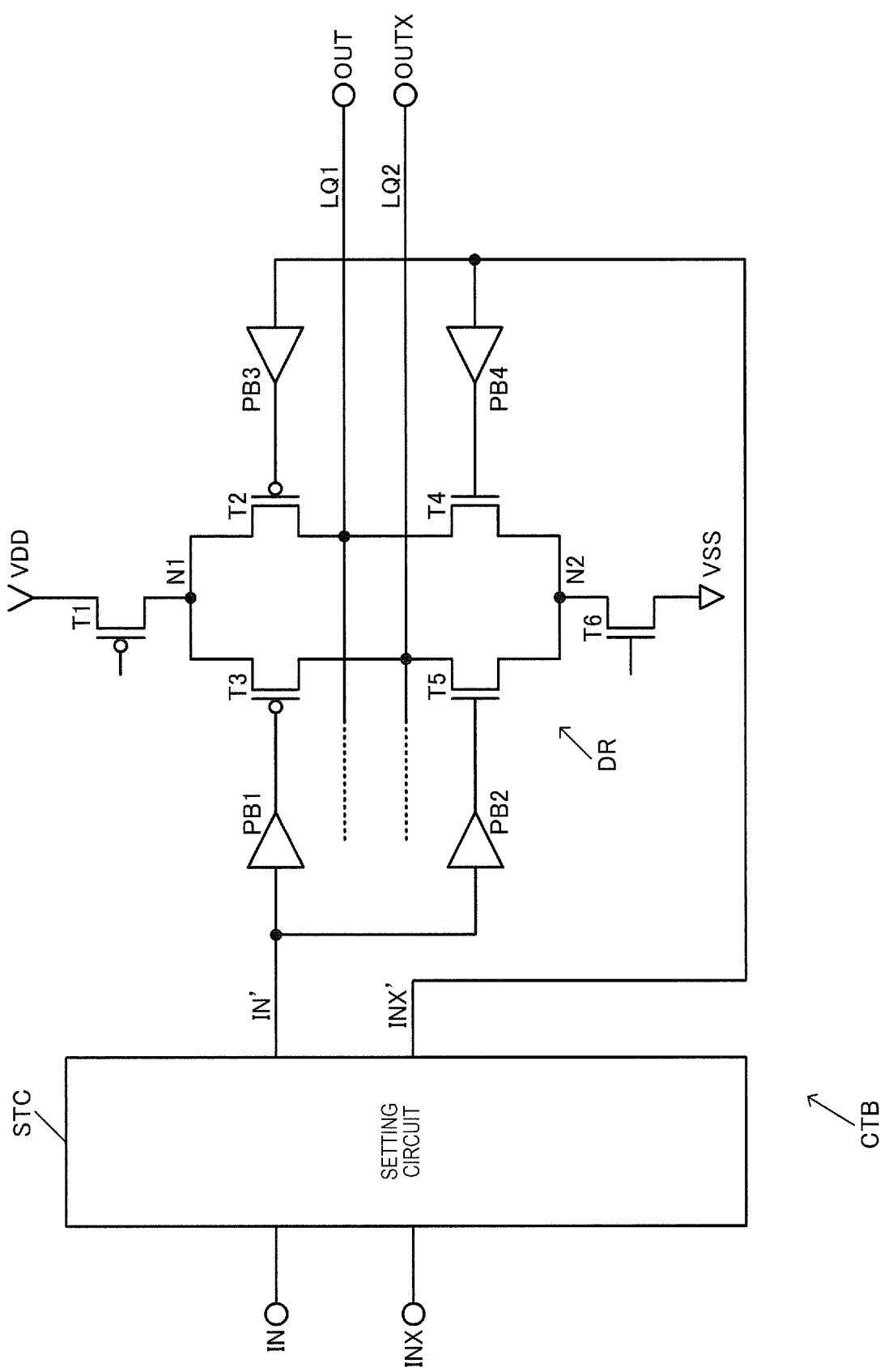
FIG. 22 is a detailed configuration example of the output driver and a control block.

Specifically, in the output drivers DR1 to DR4, a bias voltage BSP1 is applied to the gate of the P-type transistor T1 as the current source. The signals corresponding to the input signals IN are input to the transistors T3 and T5 constituting the differential section, and the signals corresponding to the input signals INX are input to the transistors T2 and T4 constituting the differential section. Specifically, the signals obtained by buffering the input signals IN and INX are input as illustrated in FIG. 22 to be described below. A bias voltage BSN is also applied to the gate of the N-type transistor T6 constituting the load resistance section.

The bias voltage BSP1 is applied to the gate of the transistor T1 of each of the output drivers DR1 to DR4, and thus, a drive current of, for example, Is=875 μA flows in each output driver of the DR1 to DR4. Accordingly, a drive current of 4×875 μA=3.5 mA in total can flow similarly to the output driver of LVDS of FIG. 2. That is, it is possible to drive the output signal lines LQ1 and LQ2 with the current of 3.5 mA. As shown in FIG. 15 to be described below, an output driver in which a drive current of 4×Is=4× 875 μA flows may be provided, and the output signal lines LQ1 and LQ2 may be driven by using one output driver in which i=1.

Meanwhile, in FIG. 9, in the output drivers DR5 to DR20, VDD is applied to the gate of the P-type transistor T1, and VSS is applied to the gate of the N-type transistor T6. Accordingly, these transistors T1 and T6 are turned off. The transistors TB3 and TB4 are also turned off by applying VDD to the gates of the P-type transistors TB3 and TB4 of the bias current circuit 30. Accordingly, the operations of the output drivers DR5 to DR20 and the bias current circuit 30 are turned off, and thus, the output signal lines LQ1 and LQ2 can be driven by only the output drivers DR1 to DR4 of which the operations are turned on.

Figure 10:
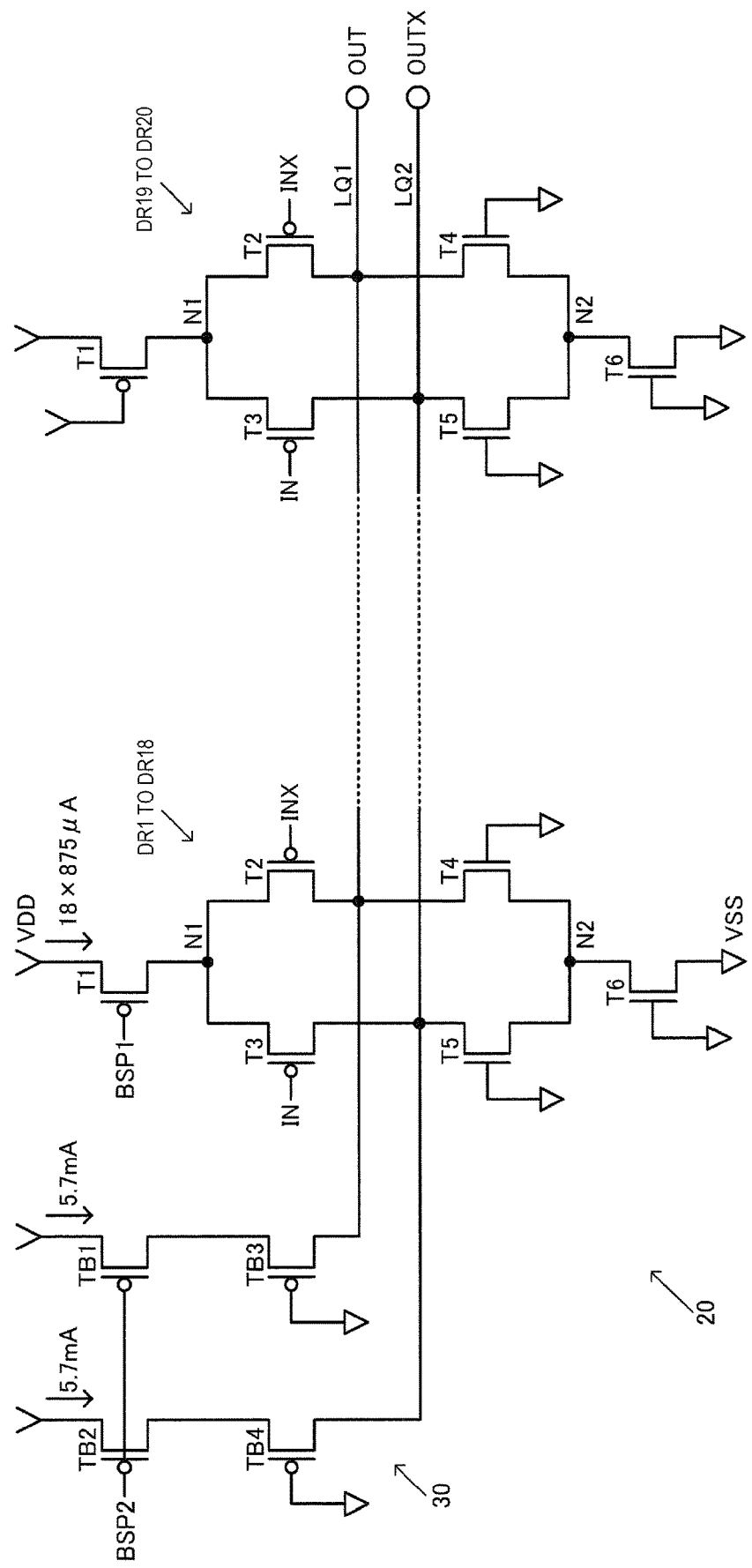
FIG. 10 is an operation explanatory diagram of the circuit device in an operation mode of PECL.

FIG. 10 is an operation explanatory diagram of the circuit device 20 in an operation mode of PECL. The operation mode of PECL is, for example, a second mode. In the operation mode of PECL, among the output drivers DR1 to DRn, 18 output drivers DR1 to DR18 in which j=18 drive the output signal lines LQ1 and LQ2 based on the input signals IN and INX. That is, the operations of the 18 output drivers DR1 to DR18 are turned on, and these output drivers output the output signals OUT and OUTX to the output signal lines LQ1 and LQ2. Among the output drivers DR1 to DR20, the operations of the output drivers DR19 and DR20 other than the 18 output drivers DR1 to DR18 are turned off.

Specifically, in the output drivers DR1 to DR18, the bias voltage BSP1 is applied to the gate of the transistor T1. The signal corresponding to the input signal IN is input to the transistor T3, and the signal corresponding to the input signal INX is input to the transistor T2. Meanwhile, VSS=GND is applied to the gates of the N-type transistors T4, T5, and T6, and thus, these transistors T4, T5, and T6 are turned off. The bias voltage BSP1 is applied to the gate of the transistor T1 of each of the output drivers DR1 to DR18, and thus, a drive current of 18×875 µA=15.75 mA in total can flow substantially similarly to the output driver of PECL of FIG. 3.

The drive current of 18×875 µA=15.75 mA flows in FIG. 10, and does not completely coincide with the drive current of 15.25 mA of FIG. 3. However, a difference between these drive currents is within an allowable error difference range in the standard of the interface as shown in FIG. 7. In FIG. 15 to be described below, a total of six output drivers in which j=6 may be used by using four output drivers in which a drive current of 4×Is=4×875 µA flows and two output drivers in which a drive current of Is=875 µA flows. In such a configuration, the drive current of 4×4×875 µA=2×875 µA=18×875 µA=15.75 mA in total can also flow.

In FIG. 10, the transistors TB3 and TB4 are turned on by applying a bias voltage BSP2 to the gates of the transistors TB1 and TB2 of the bias current circuit 30 and applying VSS to the gates of the P-type transistors TB3 and TB4. Accordingly, the operation of the bias current circuit 30 is turned on, and thus, it is possible to realize the bias current circuit 30 in which the bias current of 5.7 mA flows substantially similarly to the output driver of PECL of FIG. 3.

Meanwhile, in the output drivers DR19 to DR20, the transistors T1 and T6 are turned off by respectively applying VDD and VSS to the gates of the transistors T1 and T6. Accordingly, the operations of the output drivers DR19 and DR20 are turned off, and thus, the output signal lines LQ1 and LQ2 can be driven by only the bias current circuit 30 and the output drivers DR1 to DR18 of which the operations are turned on.

Figure 11:
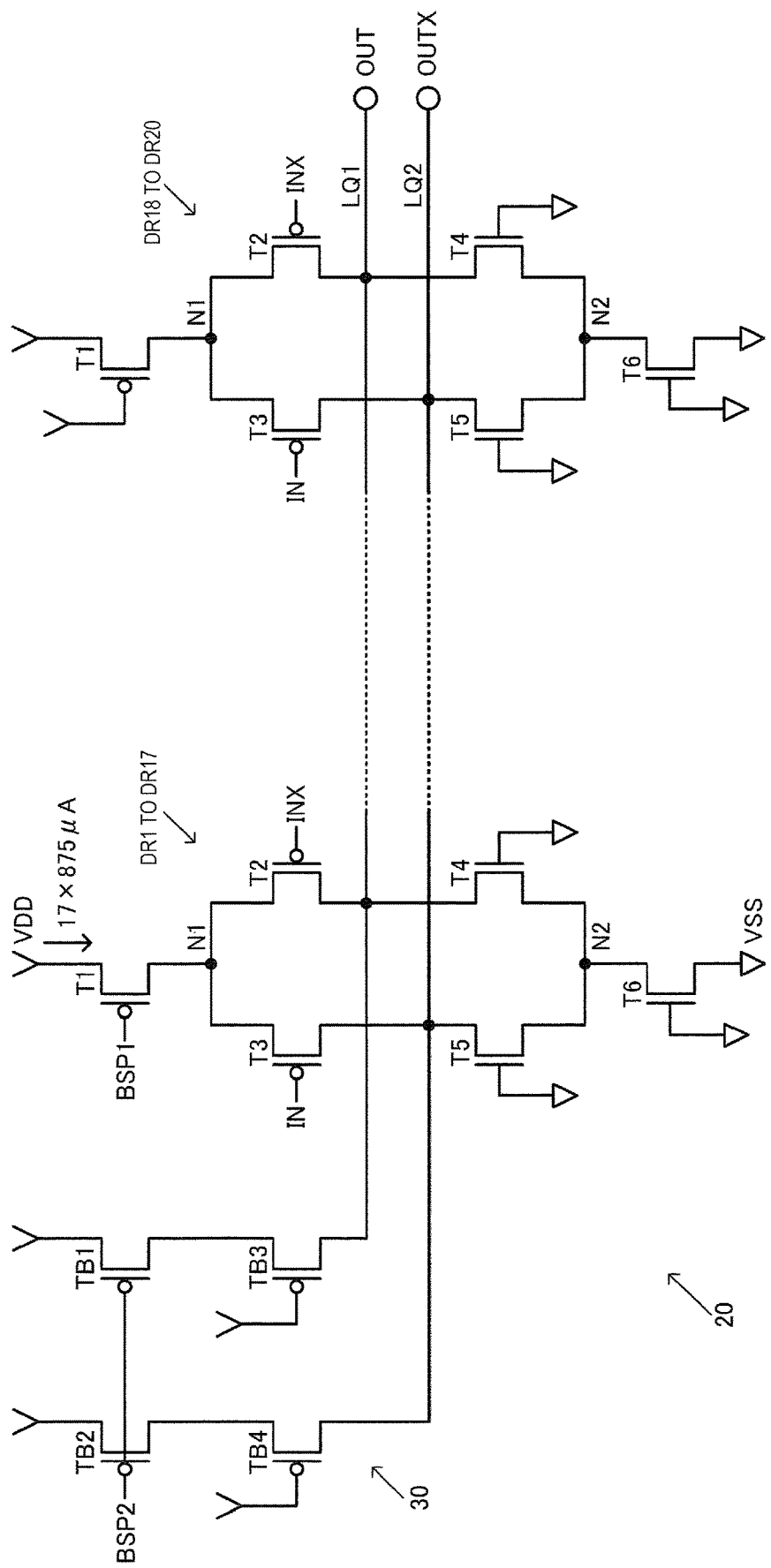
FIG. 11 is an operation explanatory diagram of the circuit device in an operation mode of HCSL.

FIG. 11 is an operation explanatory diagram of the circuit device 20 in an operation mode of HCSL. The operation mode of HCSL is, for example, a third mode. In the operation mode of HCSL, among the output drivers DR1 to DRn, 17 output drivers DR1 to DR17 in which k=17 (k is an integer of 1≤k≤n) drive the output signal lines LQ1 and LQ2 based on the input signals IN and INX. That is, the operations of the 17 output drivers DR1 to DR17 are turned on, and these 17 output drivers output the output signals OUT and OUTX to the output signal lines LQ1 and LQ2. Among the output drivers DR1 to DR20, the operations of the output drivers DR18 to DR20 other than the 17 output drivers DR1 to DR17 are turned off.

Specifically, in the output drivers DR1 to DR17, the bias voltage BSP1 is applied to the gate of the transistor T1. The signal corresponding to the input signal IN is input to the transistor T3 constituting the differential section, and the signal corresponding to the input signal INX is input to the transistor T2 constituting the differential section. Meanwhile, VSS=GND is applied to the gates of the N-type transistors T4, T5, and T6, and thus, these transistors T4, T5, and T6 are turned off. The bias voltage BSP1 is applied to the gate of the transistor T1 of each of the output drivers DR1 to DR17, and thus, the drive current of 17×875 µA=14.875 mA in total can flow substantially similarly to the output driver of HCSL of FIG. 4. The N-type transistors T4, T5, and T6 are turned off, and thus, the output signal lines LQ1 and LQ2 can be driven by only the P-type transistors T1, T2, and T3 similarly to FIG. 4.

The drive current of 17×875 µA=14.875 mA flows in FIG. 11, and does not completely coincide with the drive current of 15 mA of FIG. 4. However, a difference between these drive currents is within an allowable error range in the standard of the interface as shown in FIG. 8. In FIG. 15 to be described below, a total of five output drivers in which k=5 may be used by using four output drivers in which a drive current of 4×Is=4×875 µA flows and one output driver in which a drive current of Is=875 µA flows. In such a configuration, the drive current of 4×4×875 µA+875 µA=17×875 µA=14.875 mA in total can also flow.

Meanwhile, in the output drivers DR18 to DR20, the transistors T1 and T6 are turned off by respectively applying VDD and VSS to the gates of the transistors T1 and T6. In the bias current circuit 30, the transistors TB3 and TB4 are also turned off by applying VDD to the gates thereof. Accordingly, the operations of the output drivers DR18 to DR20 and the bias current circuit 30 are turned off, and thus, the output signal lines LQ1 and LQ2 can be driven by only the output drivers DR1 to DR17 of which the operations are turned on.

Figure 12:
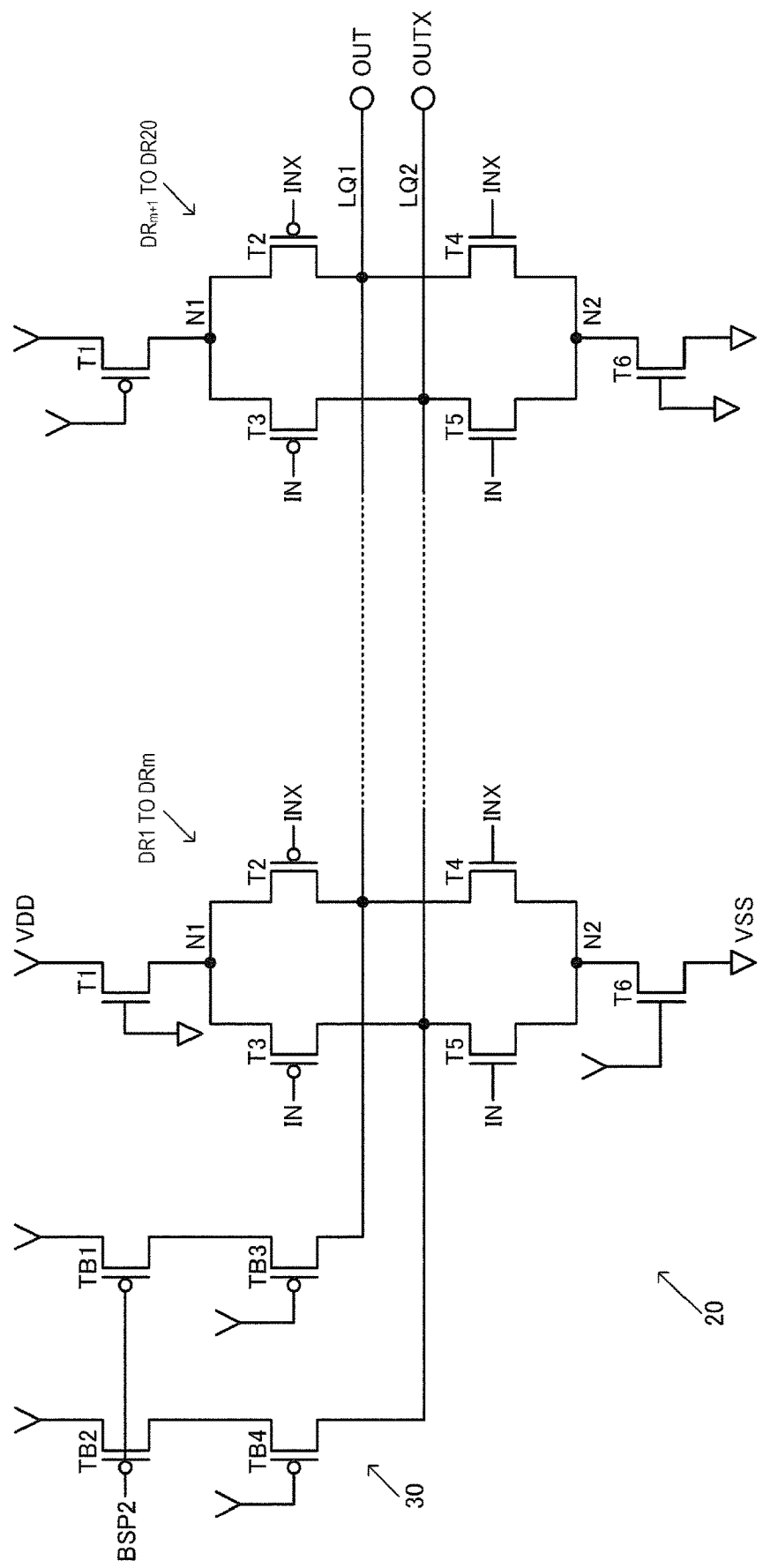
FIG. 12 is an operation explanatory diagram of the circuit device in an operation mode of CMOS.

FIG. 12 is an operation explanatory diagram of the circuit device 20 in an operation mode of CMOS. The operation mode of CMOS is, for example, a fourth mode. In the operation mode of CMOS, among the output drivers DR1 to DR20, m number (m is an integer of 1≤m≤n) of output drivers DR1 to DRm drive the output signal lines LQ1 and LQ2 based on the input signals IN and INX. That is, the operations of the m number of output drivers DR1 to DRm are turned on, and these output drivers output the output signals OUT and OUTX to the output signal lines LQ1 and LQ2. Among the output drivers DR1 to DR20, the operations of the output drivers DRm+1 to DR20 other than the m number of output drivers DR1 to DRm are turned off.

Specifically, in the output drivers DR1 to DRm, the transistors T1 and T6 are turned on by applying VSS to the gate of the P-type transistor T1 and applying VDD to the gate of the N-type transistor T6. The signals corresponding to the input signals IN are input to the transistors T3 and T5, and the signals corresponding to the input signals INX are input to the transistors T2 and T4. Accordingly, the output drivers DR1 to DRm are operated as buffer circuits of CMOS for differential input and differential output which buffer the input signals IN and INX and output the full swing output signals OUT and OUTX each having the voltage range of VDD to VSS.

Meanwhile, in the output drivers DRm+1 to DR20, the transistors T1 and T6 are turned off by respectively applying VDD and VSS to the gates of the transistors T1 and T6. In the bias current circuit 30, the transistors TB3 and TB4 are also turned off by applying VDD to the gates of the transistors TB3 and TB4. Accordingly, the operations of the output drivers DRm+1 to DR20 and the bias current circuit 30 are turned off, and thus, the output signal lines LQ1 and LQ2 can be driven by only the output drivers DR1 to DRm of which the operations are turned on. In this manner, it is possible to adjust a slew rate in the driving of CMOS. For example, in order to increase the slew rate in the driving of CMOS, the number of output drivers DR1 to DRm that drive the output signal lines LQ1 and LQ2 is increased by increasing m. Meanwhile, in order to decrease the slew rate in the driving of CMOS, the number of output drivers DR1 to DRm that drive the output signal lines LQ1 and LQ2 is decreased by decreasing m.

As stated above, in the circuit device 20 of the present embodiment, the signals corresponding to the input signals IN and INX are input, and the plurality of output drivers DR1 to DRn commonly coupled to the output signal lines LQ1 and LQ2 is provided. In the first mode, the i number of output drivers of the output drivers DR1 to DRn drive the output signal lines LQ1 and LQ2. In the second mode, the j number of output drivers of the output drivers DR1 to DRn drive the output signal lines LQ1 and LQ2. With such a configuration, the output signal lines LQ1 and LQ2 can be driven with the signal waveform conforming to the standards of various interfaces such as LVDS, PECL, HCSL, and CMOS as described in FIGS. 9 to 12. Since the present embodiment has the configuration in which the operations of the output drivers, among the output drivers DR1 to DRn, which are required in the operation mode of each interface, are turned on and these output drivers drive the output signal lines LQ1 and LQ2, it is possible to suppress an increase in circuit area of the circuit device 20.

For example, as a method of a comparative example of the present embodiment, a method in which all the dedicated output drivers of LVDS, PECL, HCSL, and CMOS having the configurations shown in FIGS. 2, 3, 4, and 5 are provided and the output signal lines LQ1 and LQ2 are commonly coupled to the plurality of dedicated output drivers is considered. However, in the method of the comparative example, since all the transistors constituting the output drivers of LVDS, PECL, HCSL, and CMOS need to be provided, the circuit area may become very large. In contrast, in the present embodiment, it is possible to realize the driving of each interface by using the output drivers selected among the output drivers DR1 to DRn according to each interface of LVDS, PECL, HCSL, and CMOS. Accordingly, it is possible to dramatically reduce the circuit area compared to the method of the comparative example. As a result, it is possible to realize the circuit device 20 capable of coping with various interfaces while suppressing an increase in layout area of the circuit.

In the circuit device 20 of the present embodiment, the bias current circuit 30 which is coupled to the output signal lines LQ1 and LQ2 and applies the bias current to the output signal lines LQ1 and LQ2 from VDD which is the power supply at the high potential side is provided. It is possible to realize the operation mode of the PECL or the like as described in FIG. 11 by providing the bias current circuit 30, and it is possible to cope with more various interfaces.

Although it has been described in FIGS. 9 to 12 that the first mode is the operation mode of LVDS and the second mode is the operation mode of PECL, the present embodiment is not limited thereto. For example, the first mode may be one operation mode of PECL, HCSL, and CMOS, and the second mode may be an operation mode different from the one operation mode of LVDS, HCSL, and CMOS. The circuit device 20 of the present embodiment may realize an operation mode of an interface other than LVDS, PECL, HCSL, and CMOS and an operation mode of an interface derived or developed from LVDS, PECL, HCSL, or CMOS.

2. Detailed Configuration Example

Figure 13:
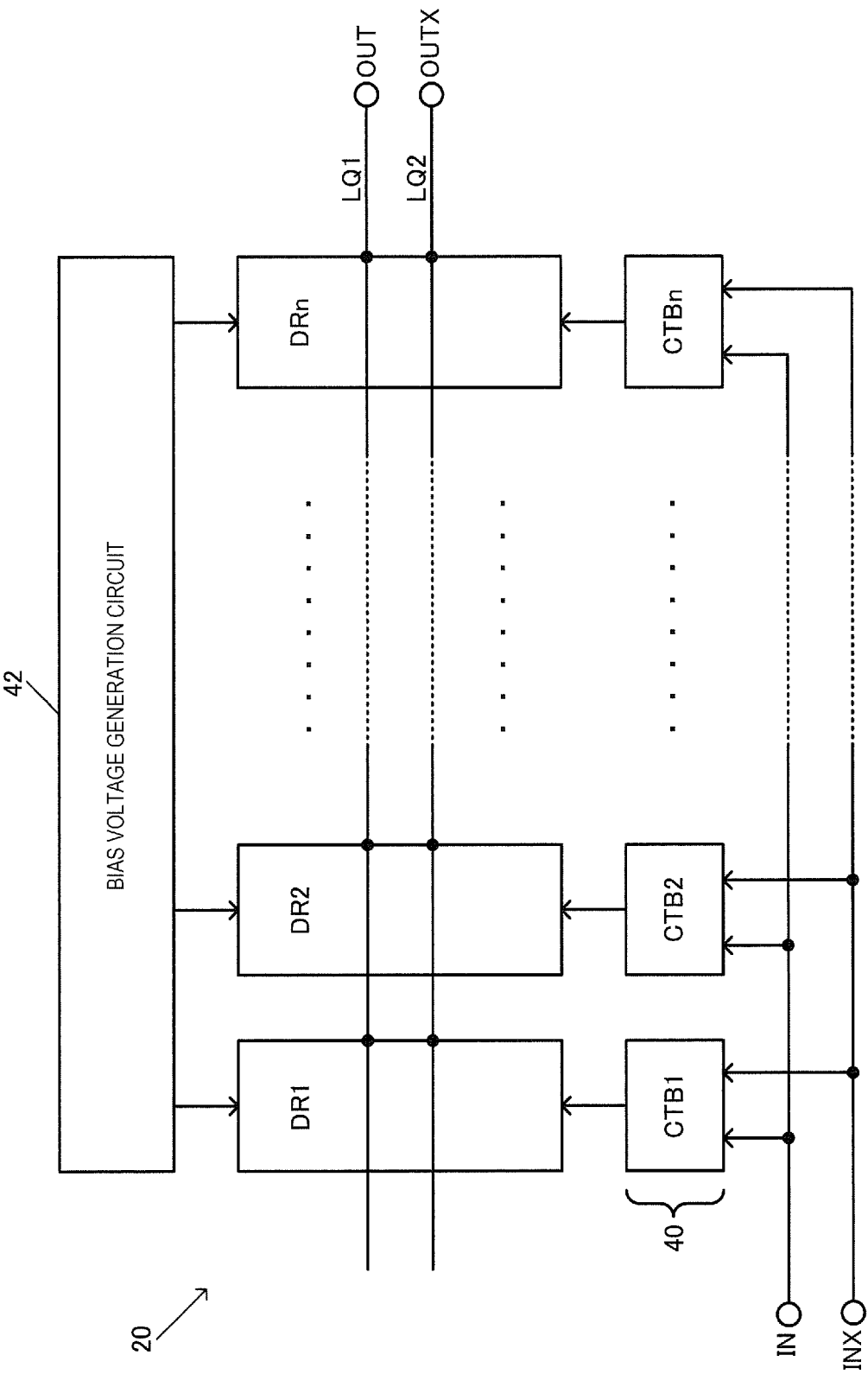
FIG. 13 is a detailed configuration example of the circuit device.

FIG. 13 shows a detailed configuration example of the circuit device 20 of the present embodiment. The circuit device 20 of FIG. 13 includes output drivers DR1 to DRn, a control circuit 40, and a bias voltage generation circuit 42. The control circuit 40 includes control blocks CTB1 to CTBn. Each control block of the control blocks CTB1 to CTBn is provided so as to correspond to each output driver of the plurality of output drivers DR1 to DRn.

The input signals IN and INX are input to the control circuit 40. Specifically, the input signals IN and INX are input to the control blocks CTB1 to CTBn of the control circuit 40. For example, in FIG. 24 to be described below, an oscillation signal generation circuit 70 that generates an oscillation signal OSCK by using, for example, a resonator 10 is provided in the circuit device 20. In this case, the input signals IN and INX are signals based on the oscillation signal OSCK. That is, the differential input signals IN and INX from the oscillation signal generation circuit 70 are input to the control circuit 40.

The control circuit 40 outputs the signals obtained by buffering the input signals IN and INX to the output drivers DR1 to DRn. For example, the control block CTB1 outputs the signal obtained by buffering the input signals IN and INX to the output driver DR1. The control block CTB2 outputs the signal obtained by buffering the input signals IN and INX to the output driver DR2. Similarly, the control blocks CTB3 to CTBn output the signals obtained by buffering the input signals IN and INX to the output drivers DR3 to DRn. The control circuit 40 outputs a control signal for turning on or off the transistors of the output drivers DR1 to DRn. In the example of FIG. 11, the control circuit 40 sets GND to the gates of the N-type transistors T4, T5, and T6, and outputs a control signal for turning off the transistors T4, T5, and T6. In the example of FIG. 12, the control circuit 40 sets the gate of the P-type transistor T1 to GND, sets the gate of the N-type transistor T6 to VDD, and outputs a control signal for turning on the transistors T1 and T6. In the circuit device 20, the bias current circuit 30 is provided, and the control circuit 40 outputs a control signal for turning on or off the transistors TB3 and TB4 of the bias current circuit 30. In the examples of FIGS. 9, 11, and 12, the control circuit sets the gates of the P-type transistors TB3 and TB4 to VDD, and outputs a control signal for turning off the transistors TB3 and TB4. In the example of FIG. 10, the control circuit sets the gates of the P-type transistors TB3 and TB4 to GND, and outputs a control signal for turning on the transistors TB3 and TB4.

The bias voltage generation circuit 42 generates bias voltages, and supplies the generated bias voltages to the output drivers DR1 to DRn and the bias current circuit 30. For example, the bias voltage generation circuit 42 generates bias voltages BSP1 and BSN, and supplies the generated bias voltages to the gates of the transistors T1 and T6 of the output drivers DR1 to DRn. The bias voltage generation circuit 42 generates a bias voltage BSP2, and supplies the generated bias voltage to the gates of the transistors TB1 and TB2 of the bias current circuit 30.

Next, an arrangement configuration example of the output drivers DR1 to DRn of the present embodiment will be described. For example, FIG. 14 shows a first arrangement configuration example of the output drivers DR1 to DRn. In FIG. 14, for example, 20 output drivers DR1 to DR20 are provided as the output drivers DR1 to DRn. The output drivers DR1 to DR20 are arranged so as to be adjacent to each other. For example, the output drivers DR1 to DR20 are arranged in a matrix form. Specifically, the output drivers are arranged in a matrix form of 2 rows×10 columns. The bias current circuit 30 (not shown) is disposed at region adjacent to an arrangement region of the output drivers DR1 to DR20.

Each output driver of DR1 to DR20 includes a drive current source that applies a drive current having a current value Is. In the example of FIG. 1, the drive current source is realized by the transistor T1 for the drive current source in which the bias voltage is applied to the gate. The current value of the drive current source of each of the output drivers DR1 to DR20 is, for example, Is=875 µA.

With such a configuration, in the example of FIG. 9, the operation mode of LVDS can be realized by turning on the operations of four output drivers of the output drivers DR1 to DR20 and turning off the operations of the 16 remaining output drivers. In the example of FIG. 10, the operation mode of PECL can be realized by turning on the operations of 18 output drivers of the output drivers DR1 to DR20, turning off the operations of the two remaining output drivers, and turning on the operation of the bias current circuit 30. In the example of FIG. 11, the operation mode of HCSL can be realized by turning on the operations of 17 output drivers of the output drivers DR1 to DR20 and turning off the operations of the three remaining output drivers. In the example of FIG. 12, the operation mode of CMOS at a slew rate set in m number of output drivers can be realized by turning on the operations of the m number of output drivers of the output drivers DR1 to DR20 and turning off the operations of the remaining output drivers.

FIG. 15 shows a second arrangement configuration example of the output drivers DR1 to DRn. In FIG. 15, output drivers DA1 to DA4 of a first group GR1 and output drivers DB1 to DB4 of a second group GR2 are provided as the output drivers DR1 to DRn. The output drivers DA1 to DA4 and DB1 to DB4 are arranged so as to be adjacent to each other. For example, the output drivers DA1 to DA4 and DB1 to DB4 are arranged in a matrix form. Specifically, the output drivers DA1 to DA4 are arranged in a matrix of 2 rows×2 columns, and the output drivers DB1 to DB4 are arranged so as to be adjacent to each other in a matrix of 2 rows×2 columns. The bias current circuit 30 (not shown) is disposed at a region adjacent to an arrangement region of the output drivers DA1 to DA4 and DB1 to DB4.

In the first and second arrangement configuration examples of FIGS. 14 and 15, it is assumed that not only the transistors T1 to T6 constituting each output driver but also the control blocks of a pre-driver corresponding to each output driver are arranged in each arrangement region of the output drivers DR1 to DR20 or DA1 to DA4 and DB1 to DB4.

In the present embodiment, the output drivers DR1 to DRn include the output drivers DA1 to DA4 of the first group GR1 including the drive current sources that apply the drive currents each having a current value Is and the output drivers DB1 to DB4 of the second group GR2 including the drive current sources that apply the drive currents each having a current value of a×Is=4×Is. In the example of FIG. 1, these drive current sources are realized by the transistors T1 for the drive current sources in which the bias voltage is applied to the gate. For example, Is=875 μA.

As stated above, in FIG. 15, the output drivers DA1 to DA4 of the first group GR1 of the output drivers DR1 to DRn have the drive current sources that apply the drive currents each having the current value Is. Meanwhile, the output drivers DB1 to DB4 of the second group GR2 of the output drivers DR1 to DRn have the drive current sources that apply the drive currents each having the current value a×Is=4×Is. Here, a is an integer of 2 or more. The drive current source that applies the drive current having the current value a×Is can be realized by increasing the transistor size of the transistor T1 of FIG. 1 to, for example, about a times as large as the transistor size in the case of the drive current source that applies the drive current having the current value Is. In this case, it is desirable that the transistor sizes of the transistors T2, T3, T4, T5, and T6 are also increased.

According to the second arrangement configuration example of FIG. 15, it is possible to cope with various interfaces. In the example of FIG. 9, the operation mode of LVDS can be realized by turning on the operation of one output driver of the output drivers DB1 to DB4 of the second group GR2 in which the current value is 4×Is, turning off the operations of the three remaining output drivers of the second group GR2, and turning off the operations of the output drivers DA1 to DA4 of the first group GR1. That is, the drive current of i×Is=4×875 μA=3.5 mA can flow, and it is possible to realize the operation mode of LVDS.

In the example of FIG. 10, among all the output drivers DB1 to DB4 of the second group GR2 in which the current value is 4×Is and the output drivers DA1 to DA4 of the first group GR1 in which the current value is Is, the operations of two output drivers are turned on, and the operations of the two remaining output drivers are turned off. The operation of the bias current circuit 30 is turned on. Accordingly, it is possible to realize the operation mode of PECL. That is, it is possible to realize the operation mode of PECL by applying the drive current of 4×4×Is+2×Is=18×875 μA=115.750 mA and the bias current of 5.7 mA from the bias current circuit 30.

In the example of FIG. 11, among all the output drivers DB1 to DB4 of the second group GR2 in which the current value is 4×Is and the output drivers DA1 to DA4 of the first group GR1 in which the current value is Is, the operation of one output driver is turned on, and the operations of the three remaining output drivers are turned off. Accordingly, it is possible to realize the operation mode of HCSL. That is, the drive current of 4×4×Is+Is=17×875 μA=14.875 mA can flow, and it is possible to realize the operation mode of HCSL.

In the example of FIG. 12, the operations of p number of output drivers of the output drivers DB1 to DB4 of the second group GR2 and q number of output drivers of the output drivers DA1 to DA4 of the first group GR1 are turned off, and thus, it is possible to realize the operation mode of CMOS having a predetermined slew rate. For example, when m=4×p+q, it is possible to realize a slew rate equivalent to the slew rate when the operations of the m number of output drivers DR1 to DRm of FIG. 12 are turned on.

Figure 23:
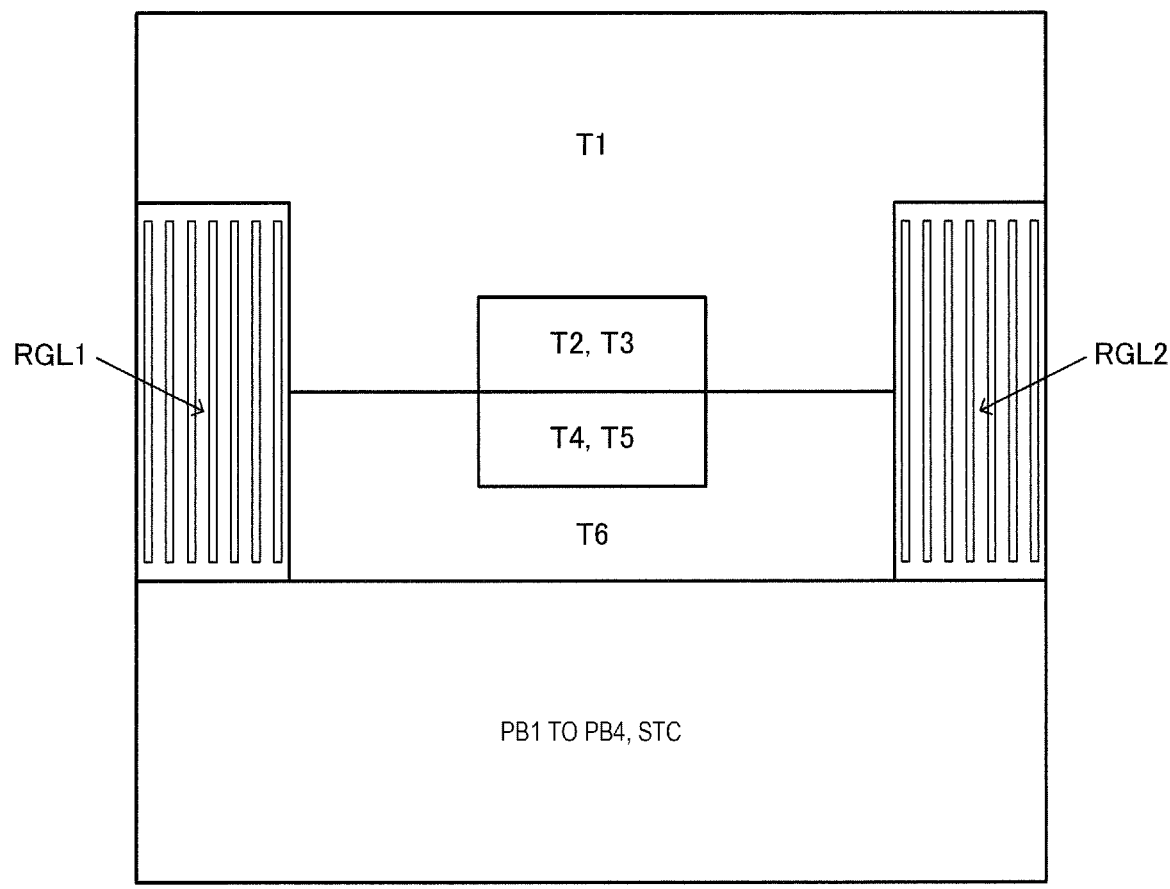
FIG. 23 is a layout arrangement example of the output driver and the control block.
Figure 23:
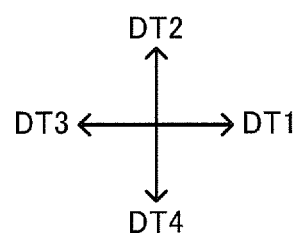

In the second arrangement configuration example of FIG. 15, it is possible to significantly reduce the layout area of the circuit device 20 compared to the first arrangement configuration example of FIG. 14. In order to realize the output driver that applies the drive current of, for example, 4×Is, it is necessary to provide, for example, four output drivers of the output drivers DR1 to DR4 in the first arrangement configuration example of FIG. 14. In contrast, for example, one output driver DB1 is simply provided in the second arrangement configuration example of FIG. 15. The layout area of the one output driver DB1 that applies the drive current of 4×Is is smaller than the layout area of the four output drivers DR1 to DR4. That is, as shown in FIGS. 22 and 23 to be described below, it is necessary to provide four pre-buffers at each output driver, and it is necessary to provide a total of 16 pre-buffers in a configuration example in which the four output drivers DR1 to DR4 are provided. In contrast, four pre-buffers are simply provided in a configuration example in which one output driver DB1 is provided. Compared to the configuration example in which the four output drivers DR1 to DR4 are provided, it is possible to reduce an area of a signal wiring region and it is possible to dramatically reduce the layout area in the configuration example in which the one output driver DB1 is provided. Accordingly, it is possible to cope with various interfaces while maintaining the circuit device 20 at a small layout area. As mentioned above, in FIGS. 14 and 15, it is assumed that not only the transistors T1 to T6 constituting the output driver but also the control blocks of each pre-driver corresponding to each output driver are arranged in the arrangement region of each output driver.

As stated above, in FIG. 15, the eight output drivers DA1 to DA4 and DB1 to DB4 are provided as the output drivers DR1 to DRn of FIG. 1, and n=8. The output drivers DA1 to DA4 of the first group GR1 include the drive current sources that apply the drive currents each having the current value Is, the output drivers DB1 to DB4 of the second group GR2 include the drive current sources that apply the drive currents each having the current value a×Is=4×Is, and a=4. In this manner, it is possible to realize various operation modes of LVDS, PECL, HCSL, and CMOS as described above, and it is possible to reduce the layout area of the circuit device 20. In particular, Is=875 µA in the present embodiment. In this manner, it is possible to realize the operation mode of LVDS of FIG. 9 by turning on the operation of one output driver of the second group GR2. It is possible to realize the operation mode of PECL of FIG. 10 by turning on the operations of four output drivers of the second group GR2 and two output drivers of the first group GR1. It is possible to realize the operation mode of HCSL of FIG. 11 by turning on the operations of four output drivers of the second group GR2 and one output driver of the first group GR1. Accordingly, it is possible to realize various operation modes of LVDS, PECL, and HCSL with a compact layout arrangement area.

FIGS. 16 to 21 show other arrangement configuration examples of the output drivers DR1 to DRn. In the present embodiment, the output drivers DR1 to DRn include output drivers of a third group including drive current sources that apply drive currents each having a current value b×Is. Here, b is an integer of two or more and b≠a. For example, in FIGS. 16 to 21, D1 is the output driver of the first group including the drive current source that applies the drive current having the current value Is, and D2 is the output driver of the second group including the drive current source that applies the drive current having the current value a×Is=2×Is. In FIGS. 16, 17, 18, and 19, D3 is the output driver of the third group including the drive current source that applies the drive current having the current value b×Is=3×Is. In FIGS. 20 and 21, D4 is the output driver of the third group including the drive current source that applies the drive current having the current value b×Is=4×Is. In FIGS. 16 to 21, output drivers D5, D6, D7, D8, D9, and D10 including the current sources that apply the drive currents having the current values of 5×Is, 6×Is, 7×Is, 8×Is, 9×Is, and 10×Is are provided. When the output drivers of the first, second, and third groups are provided as stated above, it is possible to realize the operation modes of various interfaces by driving the output signal lines LQ1 and LQ2 by means of combinations of the output drivers of the groups.

FIG. 22 shows a detailed configuration example of the output driver DR and the control block CTB. As described in FIG. 13, each control block of CTB1 to CTBn of the control circuit 40 is provided so as to correspond to each output driver of DR1 to DRn. In FIG. 22, each control block of CTB1 to CTBn is referred to as the control block CTB, and each output driver of DR1 to DRn is referred to as the output driver DR.

As shown in FIG. 22, each output driver DR of the output drivers DR1 to DRn includes the transistor T1 provided between the node of VDD which is the power supply at the high potential side and the node N1 which is the first node. The transistor T1 is the transistor for the drive current source. The output driver DR includes the transistor T2 provided between the node N1 and the output signal line LQ1, and the transistor T3 provided between the node N1 and the output signal line LQ2. The transistor T1 is the transistor for driving the output signal line LQ1, and the transistor T3 is the transistor for driving the output signal line LQ2. The output driver DR includes the transistor T4 provided between the output signal line LQ1 and the node N2 which is the second node, and the transistor T5 provided between the output signal line LQ2 and the node N2. The transistor T4 is the transistor for driving the output signal line LQ1, and the transistor T5 is the transistor for driving the output signal line LQ2. The output driver DR includes the transistor T6 provided between the node N2 and the node of VSS which is the power supply at the low potential side. Here, the transistors T1, T2, T3, T4, T5, and T6 are a first transistor, a second transistor, a third transistor, a fourth transistor, a fifth transistor, and a sixth transistor. In this manner, it is possible to realize the current source for the drive current by using the transistor T1, it is possible to realize the differential section by using the transistors T2, T3, T4, andT5, and it is possible to realize the load resistance section by using the transistor T6.

In FIG. 22, the transistors T1, T2, and T3 are the P-type transistors, and the transistors T4, T5, and T6 are the N-type transistors. In this manner, it is possible to realize the current source at the high potential side by using the P-type transistor T1, and it is possible to realize the load resistance section at the low potential side by using the N-type transistor T6. It is possible to realize the differential section including the P-type and N-type transistors by using the P-type transistors T2 and T3 and the N-type transistors T4 and T5. A modification in which all the transistors of the output driver are realized by the N-type transistors may also be implemented.

In FIG. 22, the control block CTB includes a setting circuit STC, and pre-buffers PB1, PB2, PB3, and PB4. The setting circuit STC receives the differential input signals IN and INX as the inputs, and outputs differential input signals IN' and INX' obtained by performing timing adjustment or the like. The pre-buffers PB1 and PB2 buffer the input signals IN', and output the buffered input signals IN' to the gates of the transistors T3 and T5 of the output driver DR. The pre-buffers PB3 and PB4 buffer the input signals INX', and output the buffered input signals INX' to the gates of the transistors T2 and T4 of the output driver DR. The pre-buffers PB1, PB2, PB3, and PB4 are provided, and thus, the rounding of the waveforms of the signals input to the gates of the transistors T2, T3, T4, and T5 is suppressed. As a result, it is possible to appropriately drive the output signal lines LQ1 and LQ2 by using the output driver DR. The setting circuit STC also performs logic processing for setting an operation for turning on or off the transistors T1 and T6 in each operation mode described in FIGS. 9 to 12.

FIG. 23 is a layout arrangement example of the output driver DR and the control block CTB of FIG. 22. Specifically, FIG. 23 is the layout arrangement example of the output driver DR and the control block CTB when the drive current of 4×Is described in FIG. 15 flows. In FIG. 23, a direction DT2 is a direction perpendicular to a direction DT1, a direction DT3 is an opposite direction of the direction DT1, and a direction DT4 is an opposite direction of the direction DT2. The P-type transistor T1 and the N-type transistor T6 of the output driver DR are arranged along the direction DT2. The transistor sizes of the transistors T1 and T6 are sizes for applying the drive currents each having 4×Is. The P-type transistors T2 and T3 and the N-type transistors T4 and T5 constituting the differential section of the output driver DR are arranged along the direction DT2. The transistor sizes of the transistors T2, T3, T4, and T5 are smaller than the transistor sizes of the transistors T1 and T6, and are arranged in a region included in an arrangement region of the transistors T1 and T6. Wiring region RGL1 and RGL2 are provided at the direction DT3 side and the direction DT1 side of the transistors T2, T3, T4, and T5.

The pre-buffers PB1 to PB4 and the setting circuit STC of FIG. 22 are arranged at a region at the direction DT4 side of an arrangement region of the transistors T1 to T6. As shown in FIG. 23, the layout area of the arrangement region of the pre-buffers PB1 to PB4 and the setting circuit STC and the layout area of the wiring regions RGL1 and RGL2 are large. For example, in the first arrangement configuration example of FIG. 14, since the pre-buffers PB1 to PB4, the setting circuit STC, and the wiring regions RGL1 and RGL2 are provided for each output driver of DR1 to DR20, the layout area of the circuit may be increased. Meanwhile, compared to the first arrangement configuration example of FIG. 14, it is possible to reduce the layout area of the circuit by simply providing, for example, the pre-buffers PB1 to PB4, the setting circuit STC, and the wiring regions RGL1 and RGL2 for each output driver of DB1 to DB4 in the second arrangement configuration example of FIG. 15. Accordingly, it is possible to realize the operation mode of various interfaces while suppressing the increase in layout area of the circuit.

3. Oscillator

Figure 24:
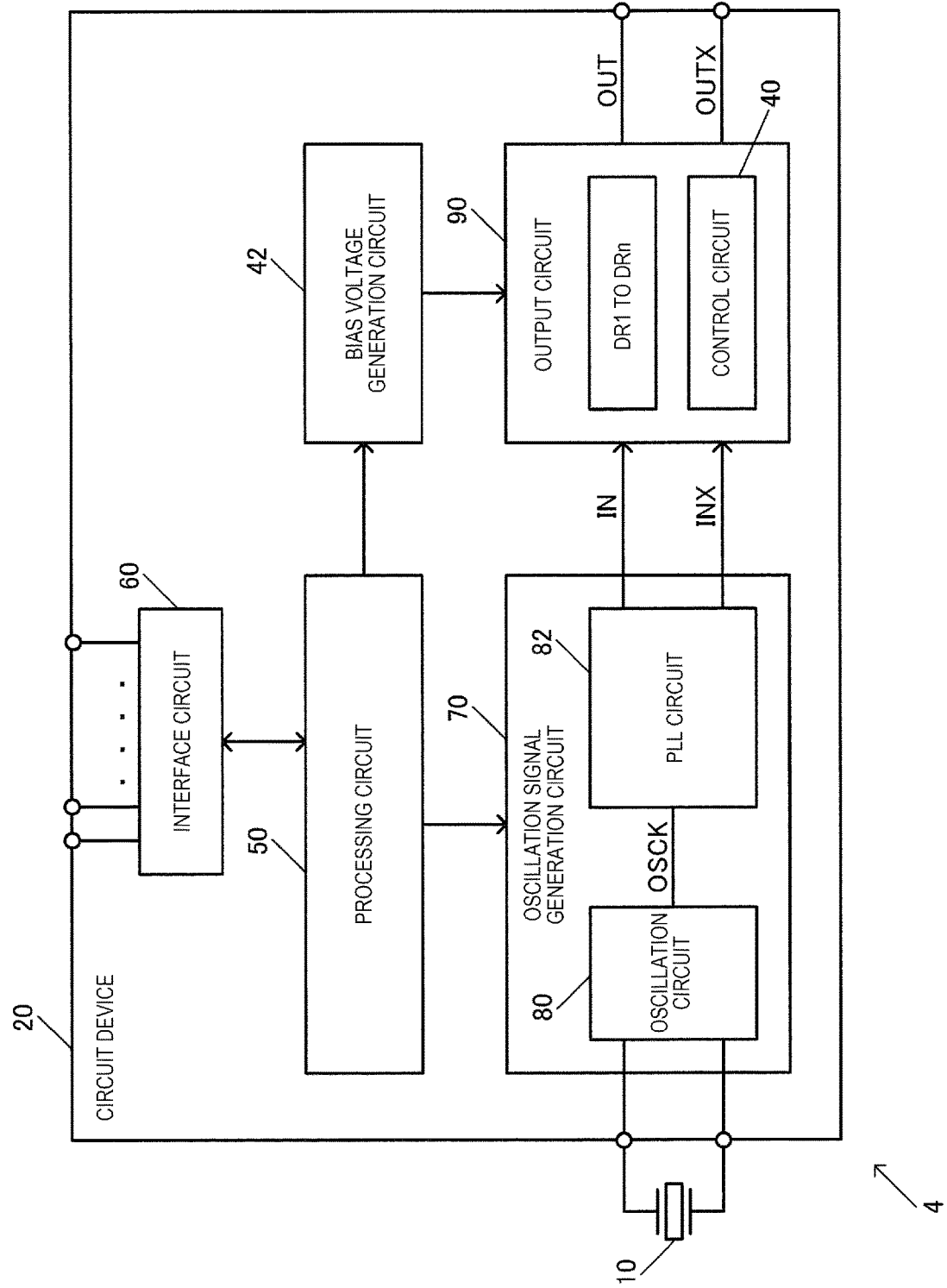
FIG. 24 is a configuration example of an oscillator.

FIG. 24 shows a configuration example of an oscillator 4 of the present embodiment. The oscillator 4 includes the circuit device 20 and the resonator 10 of the present embodiment. The circuit device 20 includes an oscillation signal generation circuit 70 that generates the oscillation signal OSCK by using the resonator 10, and the input signals IN and INX are signals based on the oscillation signal OSCK.

The resonator 10 is an element that generates mechanical vibration by an electrical signal. For example, the resonator 10 may be realized by a resonator element such as a quartz crystal resonator element. For example, the resonator 10 may be realized by a quartz crystal resonator element that has a cut angle of AT cut or SC cut and performs thickness-shear vibration. For example, the resonator 10 may be a resonator of a simple packaged crystal oscillator (SPXO). Alternatively, the resonator 10 may be a resonator built in a thermostatic crystal oscillator (OCXO) including a thermostatic chamber, or may be a resonator built in a temperature compensated crystal oscillator (TCXO) not including a thermostatic chamber. For example, the resonator 10 of the present embodiment may be realized by various resonator elements such as a resonator element other than the thickness-shear resonator and a piezoelectric resonator element made of a material other than quartz crystal. For example, a surface acoustic wave (SAW) resonator or a micro electro mechanical systems (MEMS) resonator as a silicon resonator formed by using a silicon substrate may be adopted as the resonator 10.

The circuit device 20 is an integrated circuit (IC) manufactured through a semiconductor process, and is a semiconductor chip at which a circuit element is formed on the semiconductor substrate. The circuit device 20 includes the oscillation signal generation circuit 70 and an output circuit 90. The circuit device 20 may include a processing circuit 50, an interface circuit 60, and the bias voltage generation circuit 42.

The oscillation signal generation circuit 70 includes an oscillation circuit 80, and a phase locked loop (PLL) circuit 82. The oscillation circuit 80 oscillates the resonator 10, and generates the oscillation signal OSCK. For example, the oscillation circuit 80 performs driving for oscillating the resonator 10, and generates the oscillation signal OSCK. For example, a Pierce quartz crystal oscillation circuit may be used as the oscillation circuit 80.

The PLL circuit 82 generates the input signals IN and INX for the output circuit 90 based on the oscillation signal OSCK from the oscillation circuit 80. For example, the PLL circuit generates, as the input signals IN and INX, signals obtained by multiplying a frequency of the oscillation signal OSCK, and outputs the generated signals to the output circuit 90. For example, a fractional-N type PLL circuit may be used as the PLL circuit 82. For example, the PLL circuit 82 generates, as input signals IN and INX, signals each having a frequency corresponding to a frequency code set by the processing circuit 50.

The output circuit 90 includes the output drivers DR1 to DRn, and the control circuit 40. The output circuit outputs the output signals OUT and OUTX based on the input signals IN and INX. That is, the output circuit outputs the output signals OUT and OUTX each having the signal waveform of the interface corresponding to the set operation mode. The output signals OUT and OUTX are output to the outside through an external coupling terminal of the oscillator 4. The output circuit 90 may output the output signals OUT and OUTX of multiple channels. For example, the output circuit may output the output signals OUT and OUTX of an operation mode of an interface different for each channel of the multiple channels. For example, on a first channel, the output circuit may output the output signals OUT and OUTX of the operation mode of any of LVDS, PECL, HCSL, and CMOS. On a second channel, the output circuit may output the output signals OUT and OUTX of the operation mode of any of LVDS, PECL, HCSL, and CMOS independent of the first channel.

The bias voltage generation circuit 42 generates the bias voltage for setting the drive currents flowing in the output drivers DR1 to DRn of the output circuit 90. For example, the bias voltage generation circuit 42 may be realized by an analog circuit constituted by an operational amplifier, a transistor, a resistor, or a capacitor.

The processing circuit 50 performs various control processing or setting processing of the circuit device 20. For example, the processing circuit 50 performs setting processing of the operation mode and setting processing of the output channel. The processing circuit 50 performs control processing of each circuit block of the circuit device 20. The processing circuit 50 may perform digital signal processing such as temperature compensation processing, aging correction processing, or digital filter processing. When the temperature compensation processing is performed, a temperature sensor is provided, and the processing circuit 50 performs the temperature compensation processing for compensating for temperature characteristics of the oscillation frequency based on temperature detection information from the temperature sensor, and outputs frequency control data for controlling the oscillation frequency. Specifically, the processing circuit 50 performs the temperature compensation processing for canceling or suppressing variation in oscillation frequency caused by a change in temperature based on temperature detection data changed depending on the temperature and data of temperature compensation coefficient which is an approximation function. That is, even when the temperature is changed, the processing unit performs the temperature compensation processing such that the oscillation frequency is constant. The processing circuit 50 may be realized by a circuit of an application specific integrated circuit (ASIC) using automatic placement and routing such as a gate array. Alternatively, the processing circuit 50 may be realized by a processor such as a digital signal processor (DSP) or a central processing unit (CPU).

The interface circuit 60 is a circuit that realizes an interface such as Inter Integrated Circuit (I2C) or Serial Peripheral Interface (SPI). That is, the interface circuit 60 performs interface processing between the oscillator 4 and an external device. It is possible to set the block frequencies or the output channels of the output signals OUT and OUTX by using the interface circuit 60.

4. Electronic Apparatus and Vehicle

Figure 25:
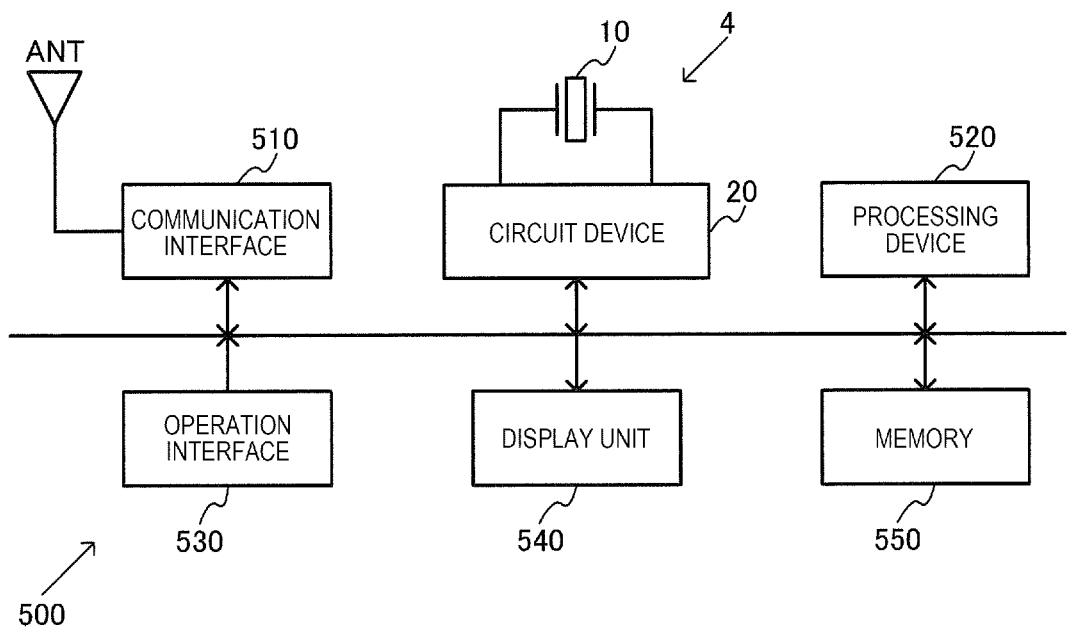
FIG. 25 is a configuration example of an electronic apparatus.

FIG. 25 shows a configuration example of an electronic apparatus 500 including the circuit device 20 of the present embodiment. The electronic apparatus 500 includes the resonator 10, the circuit device 20, andaprocessing device 520. The electronic apparatus 500 may include an antenna ANT, a communication interface 510, an operation interface 530, a display unit 540, and a memory 550. The resonator 10 and the circuit device 20 constitute the oscillator 4. The electronic apparatus 500 is not limited to the configuration of FIG. 25, and some components may be omitted from the configuration or other components may be added to the configuration. That is, various modification examples may be performed.

For example, the electronic apparatus 500 is a network-related apparatus such as a base station or a router, a high-accuracy measurement apparatus that measures physical quantities such as a distance, a time, a flow velocity, and a flow rate, a biological information measurement apparatus that measure biological information, or an in-vehicle apparatus. For example, the biological information measurement apparatus is an ultrasonic measurement device, a sphygmograph, or a blood pressure measurement device. The in-vehicle apparatus is an apparatus for automatic driving. The electronic apparatus 500 may be a wearable apparatus such as a head-mounted display device or a timepiece-related apparatus, a robot, a printing device, a projection device, a portable information terminal such as a smartphone, a content providing apparatus that distributes contents, or a video apparatus such as a digital camera or a video camera.

The communication interface 510 receives data from the outside through the antenna ANT, or performs processing for transmitting data to the outside. The processing device 520 which is the processor performs control processing of the electronic apparatus 500 and various digital processing of data transmitted and received through the communication interface 510. For example, the functions of the processing device 520 may be realized by a processor such as a microcomputer. The operation interface 530 is used by a user who performs an input operation, and may be realized by an operation button or a touch panel display. The display unit 540 displays various information, and may be realized by a liquid crystal or organic EL display. The memory 550 stores data, and the functions thereof may be realized by a semiconductor memory such as RAM or ROM.

Figure 26:
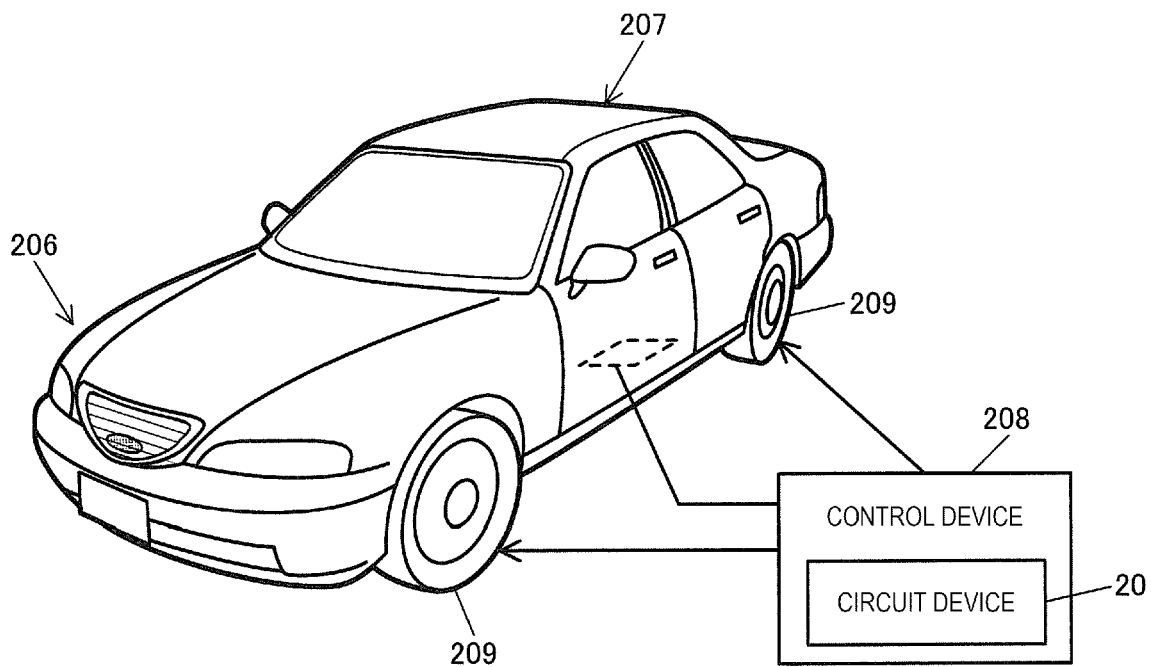
FIG. 26 is a configuration example of a vehicle.

FIG. 26 shows an example of the vehicle including the circuit device 20 of the present embodiment. For example, the circuit device 20 of the present embodiment may be incorporated into various vehicles such as a car, an airplane, a motorcycle, a bicycle, and a ship. For example, the vehicle is an apparatus or a device that includes a drive mechanism such as an engine or a motor, a steering mechanism such as a steering wheel or a rudder, and various electronic apparatuses, and moves on the ground, in the sky, or in the sea. FIG. 26 schematically shows a car 206 as a specific example of the vehicle. The oscillator (not shown) including the circuit device 20 of the present embodiment is incorporated into the car 206. A control device 208 is operated by a clock signal generated by the oscillator. For example, the control device 208 controls the hardness of a suspension according to a posture of a car body 207 or controls brakes of individual car wheels 209. For example, the automatic driving of the car 206 may be realized by the control device 208. The apparatus into which the circuit device 20 of the present embodiment is incorporated is not limited to the control device 208, and may be incorporated into various in-vehicle apparatuses such as a meter panel apparatus or a navigation apparatus provided at the vehicle such as the car 206.

As described above, the circuit device of the present embodiment includes the first output signal line from which the first output signal constituting the differential output signals is output, the second output signal line from which the second output signal constituting the differential output signals is output, and the first to n-th output drivers (n is an integer of 2 or more) for differential input and differential output coupled to the first output signal line and the second output signal line. In the first mode, the i number of output drivers (i is an integer of 1≤i≤n) of the first to n-th output drivers drive the first output signal line and the second output signal line based on the first input signal and the second input signal constituting the differential input signals. In the second mode, the j number of output drivers (j is an integer of 1≤j≤n and j≠i) of the first to n-th output drivers drive the first output signal line and the second output signal line based on the first input signal and the second input signal.

As stated above, in the present embodiment, the first and second output signal lines and the first and n-th output drivers that drive the first and second output signal lines based on the first and second input signals are provided at the circuit device. In the first mode, the i number of output drivers drive the first and second output signal lines, and thus, the first and second output signal lines can be driven with the signal waveform conforming to the standard of the first interface, for example. Meanwhile, in the second mode, the j number of output drivers drive the first and second output signal lines, and thus, the first and second output signal lines can be driven with the signal waveform conforming to the standard of the second interface, for example. In the present embodiment, since the first and second output signal lines can be driven by setting the output drivers required for each interface among the first to n-th output drivers, it is possible to suppress the increase in circuit area of the circuit device. Accordingly, it is possible to provide the circuit device capable of realizing the operation modes of various interfaces while suppressing the increase in circuit area.

In the present embodiment, the first to n-th output drivers may include the output drivers of the first group including the drive current sources that apply the drive currents each having the current value Is and the output drivers of the second group including the drive current sources that apply the drive currents each having the current value a×Is (a is an integer of 2 or more).

In this manner, it is possible to cope with the operation modes of various interfaces in which the current values of the drive currents are different by turning on the operations of some output drivers of the output drivers of the first group that apply the drive currents each having the current value Is or turning on the operations of some output drivers of the output drivers of the second group that apply the drive currents each having the current value a×Is.

In the present embodiment, n may be 8, and a may be 4. In this manner, the output drivers of the first group that apply the drive currents each having the current value Is and the output drivers of the second group that apply the drive currents each having the current value 4×Is are provided as the first to eighth output drivers. It is possible to cope with the operation modes of various interfaces in which the current values of the drive currents are different by turning on the operations of some output drivers of the first group that apply the drive currents each having the current value Is or turning on the operations of some output drivers of the second group that apply the drive currents each having the current value 4×Is.

In the present embodiment, Is may be 875 μA. In this manner, it is possible to cope with the operation modes of various interfaces required to apply drive currents having current values corresponding to multiple of Is=875 JLA.

In the present embodiment, the first to n-th output drivers may include the output drivers of the third group including the drive current sources that apply the drive currents each having the current value b×Is (b is an integer of 2 or more and b≠a).

In this manner, it is possible to cope with the operation modes of various interfaces by turning on the operations of some output drivers of the first group that apply the drive currents each having the current value Is, turning on the operations of some output drivers of the second group that apply the drive currents each having the current value a×Is, or turning on the operations of some output drivers of the third group that apply the drive currents each having the current value b×Is.

In the present embodiment, the circuit device may include the bias current circuit that is coupled to the first output signal line and the second output signal line and applies the bias current to the first output signal line and the second output signal line from the power supply at the high potential side.

In this manner, the first and second output signal lines can be driven by using the bias current from the bias current circuit in addition to the drive currents from the output drivers when coping with an operation mode of a predetermined interface.

In the present embodiment, each output driver of the first to n-th output drivers may include the first transistor provided between the node of the power supply at the high potential side and the first node, the second transistor provided between the first node and the first output signal line, and the third transistor provided between the first node and the second output signal line. Each output driver may include the fourth transistor provided between the first output signal line and the second node, the fifth transistor provided between the second output signal line and the second node, and the sixth transistor provided between the second node and the node of the power supply at the low potential side.

In this manner, the first and second output signal lines can be driven by the first transistor as the transistor for the drive current source and using the differential section constituted by the second, third, fourth, and fifth transistors.

In the present embodiment, the first to third transistors may be the P-type transistors, and the fourth to sixth transistors may be the N-type transistors.

In this manner, the current source at the high potential side may be realized by the P-type first transistor, and the load resistance section at the low potential side may be realized by the N-type sixth transistor. The differential section may be realized by the P-type second and third transistors and the N-type fourth and fifth transistors.

In the present embodiment, the operations of the output drivers other than the i number of output drivers of the first to n-th output drivers may be turned off in the first mode, the operations of the output drivers other than the j number of output drivers of the first to n-th output drivers may be turned off in the second mode.

In this manner, the first and second output signal lines can be driven by using only the i number of output drivers in the first mode, and the first and second output signal lines can be driven by using only the j number of output drivers in the second mode. Accordingly, it is possible to appropriately drive the first and second output signal lines by using output drivers as much as the output drivers corresponding to each interface.

In the present embodiment, the circuit device may include the oscillation signal generation circuit that generates the oscillation signal by using the resonator, and the first input signal and the second input signal may be the signals based on the oscillation signal.

In this manner, the signals obtained by buffering the first and second input signals based on the oscillation signal generated by using the resonator by means of the first to n-th output drivers can be output as the first and second output signals each having the signal waveform corresponding to each interface.

The present embodiment relates to the oscillator including the circuit device and the resonator.

The present embodiment relates to the electronic apparatus including the aforementioned circuit device.

The present embodiment relates to the vehicle including the aforementioned circuit device.

While the present embodiment has been described in detail, it will be easily understood by those skilled in the art that many modifications are possible without substantially departing from the novelty and effects of the present disclosure. Therefore, all the modifications may be included in the scope of the present disclosure. For example, in the specification or drawings, the terms described together with broader or synonymous different terms at least once may be replaced with different terms in any of the specification or drawings. All combinations of the present embodiment and the modification example are also included in the present embodiment. The configurations and operations of the circuit device, the oscillator, the electronic apparatus, and the vehicle or the circuit configuration and arrangement configuration of the output drivers are also not limited to those described in the present embodiment, and may be variously modified.

What is claimed is:

1. A circuit device comprising:
a first output signal line from which a first output signal constituting differential output signals is output;
a second output signal line from which a second output signal constituting the differential output signals is output; and
first to n-th output drivers for differential input and differential output that are coupled to the first output signal line and the second output signal line, n being an integer of 2 or more, wherein
in a first mode, i number of output drivers of the first to n-th output drivers drive the first output signal line and the second output signal line based on a first input signal and a second input signal constituting differential input signals, i being an integer of $1 \leq i \leq n$,
in a second mode, j number of output drivers of the first to n-th output drivers drive the first output signal line and the second output signal line based on the first input signal and the second input signal, j being an integer of 1≤j≤n and j≠i, and the first to n-th output drivers include
output drivers of a first group including drive current sources that apply drive currents each having a current value Is, and
output drivers of a second group including drive current sources that apply drive currents each having a current value a×Is, a being an integer of 2 or more.

2. The circuit device according to claim 1, wherein n=8, and a=4.

3. The circuit device according to claim 1, wherein Is=875 μA.

4. The circuit device according to claim 1, wherein the first to n-th output drivers include output drivers of a third group including drive current sources that apply drive currents each having a current value b×Is, b being an integer of 2 or more and b≠a.

5. The circuit device according to claim 1, further comprising:
a bias current circuit that is coupled to the first output signal line and the second output signal line and applies a bias current to the first output signal line and the second output signal line from a power supply at a high potential side.

6. The circuit device according to claim 1, wherein
each output driver of the first to n-th output drivers includes
a first transistor provided between a node of a power supply at a high potential side and a first node,
a second transistor provided between the first node and the first output signal line,
a third transistor provided between the first node and the second output signal line,
a fourth transistor provided between the first output signal line and a second node,
a fifth transistor provided between the second output signal line and the second node, and
a sixth transistor provided between the second node and a node of a power supply at a low potential side.

7. The circuit device according to claim 6, wherein the first to third transistors are P-type transistors, and the fourth to sixth transistors are N-type transistors.

8. The circuit device according to claim 1, wherein
in the first mode, operations of output drivers other than the i number of output drivers of the first to n-th output drivers are turned off, and
in the second mode, operations of output drivers other than the j number of output drivers of the first to n-th output drivers are turned off.

9. The circuit device according to claim 1, further comprising:
an oscillation signal generation circuit that generates an oscillation signal by using a resonator, wherein
the first input signal and the second input signal are signals based on the oscillation signal.

10. An oscillator comprising:
the circuit device according to claim 9; and
the resonator.

11. An electronic apparatus comprising the circuit device according to claim 1.

12. A vehicle comprising the circuit device according to claim 1.

13. A circuit device comprising:
a first output signal line from which a first output signal constituting differential output signals is output;
a second output signal line from which a second output signal constituting the differential output signals is output; and
first to n-th output drivers for differential input and differential output that are coupled to the first output signal line and the second output signal line, n being an integer of 2 or more, wherein
in a first mode, i number of output drivers of the first to n-th output drivers drive the first output signal line and the second output signal line based on a first input signal and a second input signal constituting differential input signals, i being an integer of 1≤i≤n,
in a second mode, j number of output drivers of the first to n-th output drivers drive the first output signal line and the second output signal line based on the first input signal and the second input signal, j being an integer of 1≤j≤n and j≠i, and
each output driver of the first to n-th output drivers includes
a first transistor provided between a node of a power supply at a high potential side and a first node,
a second transistor provided between the first node and the first output signal line,
a third transistor provided between the first node and the second output signal line,
a fourth transistor provided between the first output signal line and a second node,
a fifth transistor provided between the second output signal line and the second node, and
a sixth transistor provided between the second node and a node of a power supply at a low potential side.

14. The circuit device according to claim 13, further comprising:
a bias current circuit that is coupled to the first output signal line and the second output signal line and applies a bias current to the first output signal line and the second output signal line from a power supply at a high potential side.

15. The circuit device according to claim 13, wherein
the first to third transistors are P-type transistors, and the fourth to sixth transistors are N-type transistors.

16. The circuit device according to claim 13, wherein
in the first mode, operations of output drivers other than the i number of output drivers of the first to n-th output drivers are turned off, and
in the second mode, operations of output drivers other than the j number of output drivers of the first to n-th output drivers are turned off.

17. The circuit device according to claim 13, further comprising:
an oscillation signal generation circuit that generates an oscillation signal by using a resonator, wherein
the first input signal and the second input signal are signals based on the oscillation signal.

18. An oscillator comprising:
the circuit device according to claim 17; and
the resonator.

19. An electronic apparatus comprising the circuit device according to claim 13.

20. A vehicle comprising the circuit device according to claim 13.

* * * * *